United States Patent
Sajeepa et al.

(10) Patent No.: US 11,671,496 B2
(45) Date of Patent: *Jun. 6, 2023

(54) LOAD BALACING FOR DISTIBUTED COMPUTING

(71) Applicant: Pure Storage, Inc., Mountain View, CA (US)

(72) Inventors: Prabhath Sajeepa, Milpitas, CA (US); Daniel Talayco, Sunnyvale, CA (US); Qing Yang, San Jose, CA (US); Robert Lee, San Carlos, CA (US)

(73) Assignee: PURE STORAGE, INC., Mountain View, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/704,751

(22) Filed: Mar. 25, 2022

(65) Prior Publication Data

US 2022/0217206 A1 Jul. 7, 2022

Related U.S. Application Data

(63) Continuation of application No. 16/799,551, filed on Feb. 24, 2020, now Pat. No. 11,310,317, which is a (Continued)

(51) Int. Cl.
*G06F 12/00* (2006.01)
*H04L 67/1097* (2022.01)
(Continued)

(52) U.S. Cl.
CPC ............ *H04L 67/1097* (2013.01); *G06F 3/06* (2013.01); *G06F 3/061* (2013.01); *G06F 3/0604* (2013.01);
(Continued)

(58) Field of Classification Search
CPC ..... H04L 67/1097; H04L 49/10; H04L 67/51; H04L 47/125; H04L 49/15; H04L 49/356;
(Continued)

(56) References Cited

U.S. PATENT DOCUMENTS 5,390,327 A 2/1995 Lubbers et al.
5,450,581 A 9/1995 Bergen et al.
(Continued)

FOREIGN PATENT DOCUMENTS

EP 2164006 3/2010
EP 2256621 12/2010
(Continued)

OTHER PUBLICATIONS

Hwang, Kai, et al. "RAID-x: A New Distributed Disk Array for I/O-Centric Cluster Computing," HPDC '00 Proceedings of the 9th IEEE International Symposium on High Performance Distributed Computing, IEEE, 2000, pp. 279-286.
(Continued)

*Primary Examiner* — Mardochee Chery

(57) ABSTRACT

A storage system is provided. The storage system includes a first storage cluster, the first storage cluster having a first plurality of storage nodes coupled together and a second storage cluster, the second storage cluster having a second plurality of storage nodes coupled together. The system includes an interconnect coupling the first storage cluster and the second storage cluster and a first pathway coupling the interconnect to each storage cluster. The system includes a second pathway, the second pathway coupling at least one fabric module within a chassis to each blade within the chassis.

20 Claims, 15 Drawing Sheets

Related U.S. Application Data continuation of application No. 15/885,666, filed on Jan. 31, 2018, now Pat. No. 10,574,754, which is a continuation-in-part of application No. 15/376,220, filed on Dec. 12, 2016, now Pat. No. 9,967,342, which is a continuation of application No. 15/167,792, filed on May 27, 2016, now Pat. No. 9,525,738, which is a continuation of application No. 14/961,665, filed on Dec. 7, 2015, now Pat. No. 9,357,010, which is a continuation of application No. 14/618,999, filed on Feb. 10, 2015, now Pat. No. 9,213,485, which is a continuation-in-part of application No. 14/296,151, filed on Jun. 4, 2014, now Pat. No. 8,850,108.

(51) Int. Cl.

| | | |
|---|---|---|
| *G06F 3/06* | (2006.01) | |
| *G11C 29/52* | (2006.01) | |
| *G06F 12/02* | (2006.01) | |
| *H04L 49/10* | (2022.01) | |
| *G06F 11/20* | (2006.01) | |
| *G06F 11/10* | (2006.01) | |
| *H03M 13/15* | (2006.01) | |
| *H04L 67/51* | (2022.01) | |

(52) U.S. Cl.
CPC .............. *G06F 3/065* (2013.01); *G06F 3/067* (2013.01); *G06F 3/0611* (2013.01); *G06F 3/0613* (2013.01); *G06F 3/0635* (2013.01); *G06F 3/0655* (2013.01); *G06F 3/0659* (2013.01); *G06F 3/0685* (2013.01); *G06F 3/0688* (2013.01); *G06F 3/0689* (2013.01); *G06F 11/1068* (2013.01); *G06F 11/2092* (2013.01); *G06F 12/0246* (2013.01); *G11C 29/52* (2013.01); *H03M 13/154* (2013.01); *H04L 49/10* (2013.01); *H04L 67/51* (2022.05); *G06F 11/108* (2013.01); *G06F 2201/805* (2013.01); *G06F 2201/845* (2013.01); *G06F 2212/7206* (2013.01); *G06F 2212/7207* (2013.01)

(58) Field of Classification Search
CPC ..... H04L 67/1004; G06F 3/06; G06F 3/0604; G06F 3/061; G06F 3/0611; G06F 3/0613; G06F 3/0635; G06F 3/065; G06F 3/0655; G06F 3/0659; G06F 3/067; G06F 3/0685; G06F 3/0688; G06F 3/0689; G06F 11/1068; G06F 11/2092; G06F 12/0246; G06F 11/108; G06F 2201/805; G06F 2201/845; G06F 2212/7206; G06F 2212/7207; G06F 3/0619; G06F 11/1076; G11C 29/52; H03M 13/154
USPC ........................................................ 711/103
See application file for complete search history.

(56) References Cited

U.S. PATENT DOCUMENTS

| | | |
|---|---|---|
| 5,479,653 A | 12/1995 | Jones |
| 5,488,731 A | 1/1996 | Mendelsohn |
| 5,504,858 A | 4/1996 | Ellis et al. |
| 5,564,113 A | 10/1996 | Bergen et al. |
| 5,574,882 A | 11/1996 | Menon et al. |
| 5,649,093 A | 7/1997 | Hanko et al. |
| 5,699,518 A | 12/1997 | Held |
| 5,883,909 A | 3/1999 | Dekoning et al. |
| 5,978,577 A | 11/1999 | Rierden |
| 6,000,010 A | 12/1999 | Legg |
| 6,260,156 B1 | 7/2001 | Garvin et al. |
| 6,269,453 B1 | 7/2001 | Krantz |
| 6,275,898 B1 | 8/2001 | DeKoning |
| 6,453,428 B1 | 9/2002 | Stephenson |
| 6,523,087 B2 | 2/2003 | Busser |
| 6,535,417 B2 | 3/2003 | Tsuda |
| 6,643,748 B1 | 11/2003 | Wieland |
| 6,725,392 B1 | 4/2004 | Frey et al. |
| 6,763,455 B2 | 7/2004 | Hall |
| 6,816,905 B1 | 11/2004 | Sheets |
| 6,836,816 B2 | 12/2004 | Kendall |
| 6,985,995 B2 | 1/2006 | Holland et al. |
| 7,032,125 B2 | 4/2006 | Holt et al. |
| 7,047,358 B2 | 5/2006 | Lee et al. |
| 7,051,155 B2 | 5/2006 | Talagala et al. |
| 7,055,058 B2 | 5/2006 | Lee et al. |
| 7,065,617 B2 | 6/2006 | Wang |
| 7,069,383 B2 | 6/2006 | Yamamoto et al. |
| 7,076,606 B2 | 7/2006 | Orsley |
| 7,107,480 B1 | 9/2006 | Moshayedi et al. |
| 7,159,150 B2 | 1/2007 | Kenchammana-Hosekote et al. |
| 7,162,575 B2 | 1/2007 | Dalal et al. |
| 7,164,608 B2 | 1/2007 | Lee |
| 7,188,270 B1 | 3/2007 | Nanda et al. |
| 7,334,156 B2 | 2/2008 | Land et al. |
| 7,370,220 B1 | 5/2008 | Nguyen et al. |
| 7,386,666 B1 | 6/2008 | Beauchamp et al. |
| 7,398,285 B2 | 7/2008 | Kisley |
| 7,424,498 B1 | 9/2008 | Patterson |
| 7,424,592 B1 | 9/2008 | Karr |
| 7,444,532 B2 | 10/2008 | Masuyama et al. |
| 7,480,658 B2 | 1/2009 | Heinla et al. |
| 7,484,056 B2 | 1/2009 | Madnani et al. |
| 7,484,057 B1 | 1/2009 | Madnani et al. |
| 7,484,059 B1 | 1/2009 | Ofer et al. |
| 7,536,506 B2 | 5/2009 | Ashmore et al. |
| 7,558,859 B2 | 7/2009 | Kasiolas |
| 7,565,446 B2 | 7/2009 | Talagala et al. |
| 7,613,947 B1 | 11/2009 | Coatney |
| 7,634,617 B2 | 12/2009 | Misra |
| 7,634,618 B2 | 12/2009 | Misra |
| 7,681,104 B1 | 3/2010 | Sim-Tang et al. |
| 7,681,105 B1 | 3/2010 | Sim-Tang et al. |
| 7,681,109 B2 | 3/2010 | Yang et al. |
| 7,730,257 B2 | 6/2010 | Franklin |
| 7,730,258 B1 | 6/2010 | Smith |
| 7,730,274 B1 | 6/2010 | Usgaonkar |
| 7,743,276 B2 | 6/2010 | Jacobsen et al. |
| 7,752,489 B2 | 7/2010 | Deenadhayalan et al. |
| 7,757,038 B2 | 7/2010 | Kitahara |
| 7,757,059 B1 | 7/2010 | Ofer et al. |
| 7,778,960 B1 | 8/2010 | Chatterjee et al. |
| 7,783,955 B2 | 8/2010 | Haratsch et al. |
| 7,814,272 B2 | 10/2010 | Barrall et al. |
| 7,814,273 B2 | 10/2010 | Barrall |
| 7,818,531 B2 | 10/2010 | Barrall |
| 7,827,351 B2 | 11/2010 | Suetsugu et al. |
| 7,827,439 B2 | 11/2010 | Matthew et al. |
| 7,831,768 B2 | 11/2010 | Ananthamurthy et al. |
| 7,856,583 B1 | 12/2010 | Smith |
| 7,870,105 B2 | 1/2011 | Arakawa et al. |
| 7,873,878 B2 | 1/2011 | Belluomini et al. |
| 7,885,938 B1 | 2/2011 | Greene et al. |
| 7,886,111 B2 | 2/2011 | Klemm et al. |
| 7,908,448 B1 | 3/2011 | Chatterjee et al. |
| 7,916,538 B2 | 3/2011 | Jeon et al. |
| 7,921,268 B2 | 4/2011 | Jakob |
| 7,930,499 B2 | 4/2011 | Duchesne |
| 7,941,697 B2 | 5/2011 | Mathew et al. |
| 7,958,303 B2 | 6/2011 | Shuster |
| 7,971,129 B2 | 6/2011 | Watson |
| 7,984,016 B2 | 7/2011 | Kisley |
| 7,991,822 B2 | 8/2011 | Bish et al. |
| 8,006,126 B2 | 8/2011 | Deenadhayalan et al. |
| 8,010,485 B1 | 8/2011 | Chatterjee et al. |
| 8,010,829 B1 | 8/2011 | Chatterjee et al. |
| 8,020,047 B2 | 9/2011 | Courtney |
| 8,046,548 B1 | 10/2011 | Chatterjee et al. |
| 8,051,361 B2 | 11/2011 | Sim-Tang et al. |

(56) References Cited

U.S. PATENT DOCUMENTS

| | | |
|---|---|---|
| 8,051,362 B2 | 11/2011 | Li et al. |
| 8,074,038 B2 | 12/2011 | Lionetti et al. |
| 8,082,393 B2 | 12/2011 | Galloway et al. |
| 8,086,603 B2 | 12/2011 | Nasre et al. |
| 8,086,634 B2 | 12/2011 | Mimatsu |
| 8,086,911 B1 | 12/2011 | Taylor |
| 8,090,837 B2 | 1/2012 | Shin et al. |
| 8,108,502 B2 | 1/2012 | Tabbara et al. |
| 8,117,388 B2 | 2/2012 | Jernigan, IV |
| 8,117,521 B2 | 2/2012 | Yang et al. |
| 8,140,821 B1 | 3/2012 | Raizen et al. |
| 8,145,838 B1 | 3/2012 | Miller et al. |
| 8,145,840 B2 | 3/2012 | Koul et al. |
| 8,175,012 B2 | 5/2012 | Haratsch et al. |
| 8,176,360 B2 | 5/2012 | Frost et al. |
| 8,176,405 B2 | 5/2012 | Hafner et al. |
| 8,180,855 B2 | 5/2012 | Aiello et al. |
| 8,200,922 B2 | 6/2012 | McKean et al. |
| 8,209,469 B2 | 6/2012 | Carpenter et al. |
| 8,225,006 B1 | 7/2012 | Karamcheti |
| 8,239,618 B2 | 8/2012 | Kotzur et al. |
| 8,244,999 B1 | 8/2012 | Chatterjee et al. |
| 8,261,016 B1 | 9/2012 | Goel |
| 8,271,455 B2 | 9/2012 | Kesselman |
| 8,285,686 B2 | 10/2012 | Kesselman |
| 8,305,811 B2 | 11/2012 | Jeon |
| 8,315,999 B2 | 11/2012 | Chatley et al. |
| 8,327,080 B1 | 12/2012 | Der |
| 8,335,769 B2 | 12/2012 | Kesselman |
| 8,341,118 B2 | 12/2012 | Drobychev et al. |
| 8,351,290 B1 | 1/2013 | Huang et al. |
| 8,364,920 B1 | 1/2013 | Parkison et al. |
| 8,365,041 B2 | 1/2013 | Chu et al. |
| 8,375,146 B2 | 2/2013 | Sinclair |
| 8,397,016 B2 | 3/2013 | Talagala et al. |
| 8,402,152 B2 | 3/2013 | Duran |
| 8,412,880 B2 | 4/2013 | Leibowitz et al. |
| 8,423,739 B2 | 4/2013 | Ash et al. |
| 8,429,436 B2 | 4/2013 | Filingim et al. |
| 8,452,928 B1 | 5/2013 | Ofer et al. |
| 8,473,698 B2 | 6/2013 | Lionetti et al. |
| 8,473,778 B2 | 6/2013 | Simitci |
| 8,473,815 B2 | 6/2013 | Yu et al. |
| 8,479,037 B1 | 7/2013 | Chatterjee et al. |
| 8,484,414 B2 | 7/2013 | Sugimoto et al. |
| 8,498,967 B1 | 7/2013 | Chatterjee et al. |
| 8,522,073 B2 | 8/2013 | Cohen |
| 8,533,408 B1 | 9/2013 | Madnani et al. |
| 8,533,527 B2 | 9/2013 | Daikokuya et al. |
| 8,539,177 B1 | 9/2013 | Ofer et al. |
| 8,544,029 B2 | 9/2013 | Bakke et al. |
| 8,549,224 B1 | 10/2013 | Zeryck et al. |
| 8,583,861 B1 | 11/2013 | Ofer et al. |
| 8,589,625 B2 | 11/2013 | Colgrove et al. |
| 8,595,455 B2 | 11/2013 | Chatterjee et al. |
| 8,615,599 B1 | 12/2013 | Takefman et al. |
| 8,627,136 B2 | 1/2014 | Shankar et al. |
| 8,627,138 B1 | 1/2014 | Clark |
| 8,639,669 B1 | 1/2014 | Douglis et al. |
| 8,639,863 B1 | 1/2014 | Kanapathippillai et al. |
| 8,640,000 B1 | 1/2014 | Cypher |
| 8,650,343 B1 | 2/2014 | Kanapathippillai et al. |
| 8,660,131 B2 | 2/2014 | Vermunt et al. |
| 8,661,218 B1 | 2/2014 | Piszczek et al. |
| 8,671,072 B1 | 3/2014 | Shah et al. |
| 8,689,042 B1 | 4/2014 | Kanapathippillai et al. |
| 8,700,875 B1 | 4/2014 | Barron et al. |
| 8,706,694 B2 | 4/2014 | Chatterjee et al. |
| 8,706,914 B2 | 4/2014 | Duchesneau |
| 8,706,932 B1 | 4/2014 | Kanapathippillai et al. |
| 8,712,963 B1 | 4/2014 | Douglis et al. |
| 8,713,405 B2 | 4/2014 | Healey et al. |
| 8,719,621 B1 | 5/2014 | Karmarkar |
| 8,725,730 B2 | 5/2014 | Keeton et al. |
| 8,751,859 B2 | 6/2014 | Becker-szendy et al. |
| 8,756,387 B2 | 6/2014 | Frost et al. |
| 8,762,793 B2 | 6/2014 | Grube et al. |
| 8,838,541 B2 | 6/2014 | Camble et al. |
| 8,769,232 B2 | 7/2014 | Suryabudi et al. |
| 8,775,858 B2 | 7/2014 | Gower et al. |
| 8,775,868 B2 | 7/2014 | Colgrove et al. |
| 8,788,913 B1 | 7/2014 | Xin et al. |
| 8,793,447 B2 | 7/2014 | Usgaonkar et al. |
| 8,799,746 B2 | 8/2014 | Baker et al. |
| 8,819,311 B2 | 8/2014 | Liao |
| 8,819,383 B1 | 8/2014 | Jobanputra et al. |
| 8,824,261 B1 | 9/2014 | Miller et al. |
| 8,832,528 B2 | 9/2014 | Thatcher et al. |
| 8,838,892 B2 | 9/2014 | Li |
| 8,843,700 B1 | 9/2014 | Salessi et al. |
| 8,850,108 B1 | 9/2014 | Hayes et al. |
| 8,850,288 B1 | 9/2014 | Lazier et al. |
| 8,856,593 B2 | 10/2014 | Eckhardt et al. |
| 8,856,619 B1 | 10/2014 | Cypher |
| 8,862,617 B2 | 10/2014 | Kesselman |
| 8,862,847 B2 | 10/2014 | Feng et al. |
| 8,862,928 B2 | 10/2014 | Xavier et al. |
| 8,868,825 B1 | 10/2014 | Hayes |
| 8,874,836 B1 | 10/2014 | Hayes |
| 8,880,793 B2 | 11/2014 | Nagineni |
| 8,880,825 B2 | 11/2014 | Lionetti et al. |
| 8,886,778 B2 | 11/2014 | Nedved et al. |
| 8,898,383 B2 | 11/2014 | Yamamoto et al. |
| 8,898,388 B1 | 11/2014 | Kimmel |
| 8,904,231 B2 | 12/2014 | Coatney et al. |
| 8,918,478 B2 | 12/2014 | Ozzie et al. |
| 8,930,307 B2 | 1/2015 | Colgrove et al. |
| 8,930,633 B2 | 1/2015 | Amit et al. |
| 8,943,357 B2 | 1/2015 | Atzmony |
| 8,949,502 B2 | 2/2015 | McKnight et al. |
| 8,959,110 B2 | 2/2015 | Smith et al. |
| 8,959,388 B1 | 2/2015 | Kuang et al. |
| 8,972,478 B1 | 3/2015 | Storer et al. |
| 8,972,779 B2 | 3/2015 | Lee et al. |
| 8,977,597 B2 | 3/2015 | Ganesh et al. |
| 8,996,828 B2 | 3/2015 | Kalos et al. |
| 9,003,144 B1 | 4/2015 | Hayes et al. |
| 9,009,724 B2 | 4/2015 | Gold et al. |
| 9,021,053 B2 | 4/2015 | Bernbo et al. |
| 9,021,215 B2 | 4/2015 | Meir et al. |
| 9,025,393 B2 | 5/2015 | Wu |
| 9,043,372 B2 | 5/2015 | Makkar et al. |
| 9,047,214 B1 | 6/2015 | Sharon et al. |
| 9,053,808 B2 | 6/2015 | Sprouse |
| 9,058,155 B2 | 6/2015 | Cepulis et al. |
| 9,063,895 B1 | 6/2015 | Madnani et al. |
| 9,063,896 B1 | 6/2015 | Madnani et al. |
| 9,098,211 B1 | 8/2015 | Madnani et al. |
| 9,110,898 B1 | 8/2015 | Chamness et al. |
| 9,110,964 B1 | 8/2015 | Shilane et al. |
| 9,112,846 B2 | 8/2015 | Kwok |
| 9,116,819 B2 | 8/2015 | Cope et al. |
| 9,117,536 B2 | 8/2015 | Yoon |
| 9,122,401 B2 | 9/2015 | Zaltsman et al. |
| 9,123,422 B2 | 9/2015 | Sharon et al. |
| 9,124,300 B2 | 9/2015 | Olbrich et al. |
| 9,134,908 B2 | 9/2015 | Horn et al. |
| 9,153,337 B2 | 10/2015 | Sutardja |
| 9,158,472 B2 | 10/2015 | Kesselman et al. |
| 9,159,422 B1 | 10/2015 | Lee et al. |
| 9,164,891 B2 | 10/2015 | Karamcheti et al. |
| 9,183,136 B2 | 11/2015 | Kawamura et al. |
| 9,189,650 B2 | 11/2015 | Jaye et al. |
| 9,201,733 B2 | 12/2015 | Verma |
| 9,207,876 B2 | 12/2015 | Shu et al. |
| 9,229,656 B1 | 1/2016 | Contreras et al. |
| 9,229,810 B2 | 1/2016 | He et al. |
| 9,235,475 B1 | 1/2016 | Shilane et al. |
| 9,244,626 B2 | 1/2016 | Shah et al. |
| 9,250,999 B1 | 2/2016 | Barroso |
| 9,251,066 B2 | 2/2016 | Colgrove et al. |
| 9,268,648 B1 | 2/2016 | Barash et al. |
| 9,268,806 B1 | 2/2016 | Kesselman et al. |
| 9,286,002 B1 | 3/2016 | Karamcheti et al. |

(56) References Cited

U.S. PATENT DOCUMENTS

| | | |
|---|---|---|
| 9,292,214 B2 | 3/2016 | Kalos et al. |
| 9,298,760 B1 | 3/2016 | Li et al. |
| 9,304,908 B1 | 4/2016 | Karamcheti et al. |
| 9,311,969 B2 | 4/2016 | Murin |
| 9,311,970 B2 | 4/2016 | Sharon et al. |
| 9,323,663 B2 | 4/2016 | Karamcheti et al. |
| 9,323,667 B2 | 4/2016 | Bennett |
| 9,323,681 B2 | 4/2016 | Apostolides et al. |
| 9,335,942 B2 | 5/2016 | Kumar et al. |
| 9,348,538 B2 | 5/2016 | Mallaiah et al. |
| 9,355,022 B2 | 5/2016 | Ravimohan et al. |
| 9,384,082 B1 | 7/2016 | Lee et al. |
| 9,384,252 B2 | 7/2016 | Akirav et al. |
| 9,389,958 B2 | 7/2016 | Sundaram et al. |
| 9,390,019 B2 | 7/2016 | Patterson et al. |
| 9,396,202 B1 | 7/2016 | Drobychev et al. |
| 9,400,828 B2 | 7/2016 | Kesselman et al. |
| 9,405,478 B2 | 8/2016 | Koseki et al. |
| 9,411,685 B2 | 8/2016 | Lee |
| 9,417,960 B2 | 8/2016 | Klein |
| 9,417,963 B2 | 8/2016 | He et al. |
| 9,430,250 B2 | 8/2016 | Hamid et al. |
| 9,430,542 B2 | 8/2016 | Akirav et al. |
| 9,432,541 B2 | 8/2016 | Ishida |
| 9,454,434 B2 | 9/2016 | Sundaram et al. |
| 9,471,579 B1 | 10/2016 | Natanzon |
| 9,477,554 B2 | 10/2016 | Chamness et al. |
| 9,477,632 B2 | 10/2016 | Du |
| 9,501,398 B2 | 11/2016 | George et al. |
| 9,525,737 B2 | 12/2016 | Friedman |
| 9,529,542 B2 | 12/2016 | Friedman et al. |
| 9,535,631 B2 | 1/2017 | Fu et al. |
| 9,552,248 B2 | 1/2017 | Miller et al. |
| 9,552,291 B2 | 1/2017 | Munetoh et al. |
| 9,552,299 B2 | 1/2017 | Stalzer |
| 9,563,517 B1 | 2/2017 | Natanzon et al. |
| 9,588,698 B1 | 3/2017 | Karamcheti et al. |
| 9,588,712 B2 | 3/2017 | Kalos et al. |
| 9,594,652 B1 | 3/2017 | Sathiamoorthy et al. |
| 9,600,193 B2 | 3/2017 | Ahrens et al. |
| 9,619,321 B1 | 4/2017 | Sharon et al. |
| 9,619,430 B2 | 4/2017 | Kannan et al. |
| 9,645,754 B2 | 5/2017 | Li et al. |
| 9,667,720 B1 | 5/2017 | Bent et al. |
| 9,710,535 B2 | 7/2017 | Aizman et al. |
| 9,733,840 B2 | 8/2017 | Karamcheti et al. |
| 9,734,225 B2 | 8/2017 | Akirav et al. |
| 9,740,403 B2 | 8/2017 | Storer et al. |
| 9,740,700 B1 | 8/2017 | Chopra et al. |
| 9,740,762 B2 | 8/2017 | Horowitz et al. |
| 9,747,319 B2 | 8/2017 | Bestler et al. |
| 9,747,320 B2 | 8/2017 | Kesselman |
| 9,767,130 B2 | 9/2017 | Bestler et al. |
| 9,781,227 B2 | 10/2017 | Friedman et al. |
| 9,785,498 B2 | 10/2017 | Misra et al. |
| 9,798,486 B1 | 10/2017 | Singh |
| 9,804,925 B1 | 10/2017 | Carmi et al. |
| 9,811,285 B1 | 11/2017 | Karamcheti et al. |
| 9,811,546 B1 | 11/2017 | Bent et al. |
| 9,818,478 B2 | 11/2017 | Chung |
| 9,829,066 B2 | 11/2017 | Thomas et al. |
| 9,836,245 B2 | 12/2017 | Hayes et al. |
| 9,891,854 B2 | 2/2018 | Munetoh et al. |
| 9,891,860 B1 | 2/2018 | Delgado et al. |
| 9,892,005 B2 | 2/2018 | Kedem et al. |
| 9,892,186 B2 | 2/2018 | Akirav et al. |
| 9,904,589 B1 | 2/2018 | Donlan et al. |
| 9,904,717 B2 | 2/2018 | Anglin et al. |
| 9,952,809 B2 | 2/2018 | Shah |
| 9,910,748 B2 | 3/2018 | Pan |
| 9,910,904 B2 | 3/2018 | Anglin et al. |
| 9,934,237 B1 | 4/2018 | Shilane et al. |
| 9,940,065 B2 | 4/2018 | Kalos et al. |
| 9,946,604 B1 | 4/2018 | Glass |
| 9,959,167 B1 | 5/2018 | Donlan et al. |
| 9,965,539 B2 | 5/2018 | D'halluin et al. |
| 9,998,539 B1 | 6/2018 | Brock et al. |
| 10,007,457 B2 | 6/2018 | Hayes et al. |
| 10,013,177 B2 | 7/2018 | Liu et al. |
| 10,013,311 B2 | 7/2018 | Sundaram et al. |
| 10,019,314 B2 | 7/2018 | Litsyn et al. |
| 10,019,317 B2 | 7/2018 | Usvyatsky et al. |
| 10,031,703 B1 | 7/2018 | Natanzon et al. |
| 10,061,512 B2 | 8/2018 | Chu et al. |
| 10,073,626 B2 | 9/2018 | Karamcheti et al. |
| 10,082,985 B2 | 9/2018 | Hayes et al. |
| 10,089,012 B1 | 10/2018 | Chen et al. |
| 10,089,174 B2 | 10/2018 | Lin |
| 10,089,176 B1 | 10/2018 | Donlan et al. |
| 10,108,819 B1 | 10/2018 | Donlan et al. |
| 10,146,787 B2 | 12/2018 | Bashyam et al. |
| 10,152,268 B1 | 12/2018 | Chakraborty et al. |
| 10,157,098 B2 | 12/2018 | Chung et al. |
| 10,162,704 B1 | 12/2018 | Kirschner et al. |
| 10,180,875 B2 | 1/2019 | Northcott |
| 10,185,730 B2 | 1/2019 | Bestler et al. |
| 10,235,065 B1 | 3/2019 | Miller et al. |
| 2002/0144059 A1 | 10/2002 | Kendall |
| 2003/0105903 A1 | 6/2003 | Garnett |
| 2003/0105984 A1 | 6/2003 | Masuyama et al. |
| 2003/0110205 A1 | 6/2003 | Johnson |
| 2004/0161086 A1 | 8/2004 | Buntin et al. |
| 2005/0001652 A1 | 1/2005 | Malik et al. |
| 2005/0076228 A1 | 4/2005 | Davis et al. |
| 2005/0177833 A1 | 8/2005 | Sauermann |
| 2005/0235132 A1 | 10/2005 | Karr et al. |
| 2005/0278460 A1 | 12/2005 | Shin et al. |
| 2005/0283649 A1 | 12/2005 | Turner et al. |
| 2006/0015683 A1 | 1/2006 | Ashmore et al. |
| 2006/0114930 A1 | 6/2006 | Lucas et al. |
| 2006/0174157 A1 | 8/2006 | Barrall et al. |
| 2006/0248294 A1 | 11/2006 | Nedved et al. |
| 2007/0079068 A1 | 4/2007 | Draggon |
| 2007/0214194 A1 | 9/2007 | Reuter |
| 2007/0214314 A1 | 9/2007 | Reuter |
| 2007/0234016 A1 | 10/2007 | Davis et al. |
| 2007/0250838 A1 | 10/2007 | Belady |
| 2007/0268905 A1 | 11/2007 | Baker et al. |
| 2007/0280483 A1 | 12/2007 | Fu |
| 2008/0080709 A1 | 4/2008 | Michtchenko et al. |
| 2008/0107274 A1 | 5/2008 | Worthy |
| 2008/0155191 A1 | 6/2008 | Anderson et al. |
| 2008/0295118 A1 | 11/2008 | Liao |
| 2009/0077208 A1 | 3/2009 | Nguyen et al. |
| 2009/0138654 A1 | 5/2009 | Sutardja |
| 2009/0216910 A1 | 8/2009 | Duchesneau |
| 2009/0216920 A1 | 8/2009 | Lauterbach et al. |
| 2010/0005511 A1 | 1/2010 | Maes |
| 2010/0017444 A1 | 1/2010 | Chatterjee et al. |
| 2010/0042636 A1 | 2/2010 | Lu |
| 2010/0094806 A1 | 4/2010 | Apostolides et al. |
| 2010/0106855 A1 | 4/2010 | Luessem |
| 2010/0115070 A1 | 5/2010 | Missimilly |
| 2010/0125695 A1 | 5/2010 | Wu et al. |
| 2010/0162076 A1 | 6/2010 | Sim-Tang et al. |
| 2010/0169707 A1 | 7/2010 | Mathew et al. |
| 2010/0174576 A1 | 7/2010 | Naylor |
| 2010/0268908 A1 | 10/2010 | Ouyang et al. |
| 2011/0040925 A1 | 2/2011 | Frost et al. |
| 2011/0060927 A1 | 3/2011 | Fillingim et al. |
| 2011/0119462 A1 | 5/2011 | Leach et al. |
| 2011/0219170 A1 | 9/2011 | Frost et al. |
| 2011/0238625 A1 | 9/2011 | Hamaguchi et al. |
| 2011/0264843 A1 | 10/2011 | Haines et al. |
| 2011/0302369 A1 | 12/2011 | Goto et al. |
| 2012/0011398 A1 | 1/2012 | Eckhardt |
| 2012/0072661 A1* | 3/2012 | Cho ............... G06F 3/0685 711/E12.001 |
| 2012/0079318 A1 | 3/2012 | Colgrove et al. |
| 2012/0089567 A1 | 4/2012 | Takahashi et al. |
| 2012/0110249 A1 | 5/2012 | Jeong et al. |
| 2012/0117075 A1 | 5/2012 | Gokulakannan |
| 2012/0131253 A1 | 5/2012 | McKnight |
| 2012/0158923 A1 | 6/2012 | Mohamed et al. |

(56) References Cited

U.S. PATENT DOCUMENTS

| | | |
|---|---|---|
| 2012/0191900 A1 | 7/2012 | Kunimatsu et al. |
| 2012/0198152 A1 | 8/2012 | Terry et al. |
| 2012/0198261 A1 | 8/2012 | Brown et al. |
| 2012/0209943 A1 | 8/2012 | Jung |
| 2012/0226934 A1 | 9/2012 | Rao |
| 2012/0246435 A1 | 9/2012 | Meir et al. |
| 2012/0260055 A1 | 10/2012 | Murase |
| 2012/0311557 A1 | 12/2012 | Resch |
| 2013/0022201 A1 | 1/2013 | Glew et al. |
| 2013/0036314 A1 | 2/2013 | Glew et al. |
| 2013/0042056 A1 | 2/2013 | Shats |
| 2013/0060884 A1 | 3/2013 | Bernbo et al. |
| 2013/0067188 A1 | 3/2013 | Mehra et al. |
| 2013/0073894 A1 | 3/2013 | Xavier et al. |
| 2013/0124776 A1 | 5/2013 | Hallak et al. |
| 2013/0132800 A1 | 5/2013 | Healy et al. |
| 2013/0151653 A1 | 6/2013 | Sawiki |
| 2013/0151771 A1 | 6/2013 | Tsukahara et al. |
| 2013/0173853 A1 | 7/2013 | Ungureanu et al. |
| 2013/0238554 A1 | 9/2013 | Yucel et al. |
| 2013/0339314 A1 | 12/2013 | Carpenter et al. |
| 2013/0339635 A1 | 12/2013 | Amit et al. |
| 2013/0339818 A1 | 12/2013 | Baker et al. |
| 2014/0040535 A1 | 2/2014 | Lee |
| 2014/0040702 A1 | 2/2014 | He et al. |
| 2014/0047263 A1 | 2/2014 | Coatney et al. |
| 2014/0047269 A1 | 2/2014 | Kim |
| 2014/0063721 A1 | 3/2014 | Herman et al. |
| 2014/0064048 A1 | 3/2014 | Cohen et al. |
| 2014/0068224 A1 | 3/2014 | Fan et al. |
| 2014/0075252 A1 | 3/2014 | Luo et al. |
| 2014/0122510 A1 | 5/2014 | Namkoong et al. |
| 2014/0136880 A1 | 5/2014 | Shankar et al. |
| 2014/0181402 A1 | 6/2014 | White |
| 2014/0237164 A1 | 8/2014 | Le et al. |
| 2014/0279929 A1 | 9/2014 | Gupta |
| 2014/0279936 A1 | 9/2014 | Bernbo et al. |
| 2014/0280025 A1 | 9/2014 | Eidson et al. |
| 2014/0289588 A1 | 9/2014 | Nagadomi et al. |
| 2014/0330785 A1 | 11/2014 | Isherwood et al. |
| 2014/0372838 A1 | 12/2014 | Lou et al. |
| 2014/0380125 A1 | 12/2014 | Calder et al. |
| 2014/0380126 A1 | 12/2014 | Yekhanin et al. |
| 2015/0032720 A1 | 1/2015 | James |
| 2015/0039645 A1 | 2/2015 | Lewis |
| 2015/0039849 A1 | 2/2015 | Lewis |
| 2015/0089283 A1 | 3/2015 | Kermarrec et al. |
| 2015/0100746 A1 | 4/2015 | Rychlik |
| 2015/0134824 A1 | 5/2015 | Mickens |
| 2015/0153800 A1 | 6/2015 | Lucas et al. |
| 2015/0180714 A1 | 6/2015 | Chunn |
| 2015/0280959 A1 | 10/2015 | Vincent |
| 2016/0246537 A1 | 2/2016 | Kim |
| 2016/0191508 A1 | 6/2016 | Bestler et al. |
| 2016/0378612 A1 | 12/2016 | Hipsh et al. |
| 2017/0091236 A1 | 3/2017 | Hayes et al. |
| 2017/0103092 A1 | 4/2017 | Hu et al. |
| 2017/0103094 A1 | 4/2017 | Hu et al. |
| 2017/0103098 A1 | 4/2017 | Hu et al. |
| 2017/0103116 A1 | 4/2017 | Hu et al. |
| 2017/0177236 A1 | 6/2017 | Haratsch et al. |
| 2018/0039442 A1 | 2/2018 | Shadrin et al. |
| 2018/0081958 A1 | 3/2018 | Akirav et al. |
| 2018/0101441 A1 | 4/2018 | Hyun et al. |
| 2018/0101587 A1 | 4/2018 | Anglin et al. |
| 2018/0101588 A1 | 4/2018 | Anglin et al. |
| 2018/0217756 A1 | 8/2018 | Liu et al. |
| 2018/0307560 A1 | 10/2018 | Vishnumolakala et al. |
| 2018/0321874 A1 | 11/2018 | Li et al. |
| 2019/0036703 A1 | 1/2019 | Bestler |

FOREIGN PATENT DOCUMENTS

| | | |
|---|---|---|
| JP | 2010-128886 A | 6/2013 |
| JP | 2013-539133 A | 1/2016 |
| JP | 2013-544386 A | 5/2016 |
| WO | WO 02-13033 | 2/2002 |
| WO | WO 2008103569 | 8/2008 |
| WO | WO 2008157081 | 12/2008 |
| WO | WO 2013032825 | 7/2013 |
| WO | WO2014-025821 A2 | 2/2014 |

OTHER PUBLICATIONS

Schmid, Patrick: "RAID Scaling Charts, Part 3:4-128 kB Stripes Compared", Tom's Hardware, Nov. 27, 2007 (http://www.tomshardware.com/reviews/RAID-SCALING-CHARTS.1735-4.html), See pp. 1-2.

Storer, Mark W. et al., "Pergamum: Replacing Tape with Energy Efficient, Reliable, Disk-Based Archival Storage," Fast '08: 6th USENIX Conference on File and Storage Technologies, San Jose, CA, Feb. 26-29, 2008 pp. 1-16.

Ju-Kyeong Kim et al., "Data Access Frequency based Data Replication Method using Erasure Codes in Cloud Storage System", Journal of the Institute of Electronics and Information Engineers, Feb. 2014, vol. 51, No. 2, pp. 85-91.

International Search Report and the Written Opinion of the International Searching Authority, PCT/US2015/018169, dated May 15, 2015.

International Search Report and the Written Opinion of the International Searching Authority, PCT/US2015/034302, dated Sep. 11, 2015.

International Search Report and the Written Opinion of the International Searching Authority, PCT/US2015/039135, dated Sep. 18, 2015.

International Search Report and the Written Opinion of the International Searching Authority, PCT/US2015/039136, dated Sep. 23, 2015.

International Search Report, PCT/US2015/039142, dated Sep. 24, 2015.

International Search Report, PCT/US2015/034291, dated Sep. 30, 2015.

International Search Report and the Written Opinion of the International Searching Authority, PCT/US2015/039137, dated Oct. 1, 2015.

International Search Report, PCT/US2015/044370, dated Dec. 15, 2015.

International Search Report amd the Written Opinion of the International Searching Authority, PCT/US2016/031039, dated May 5, 2016.

International Search Report, PCT/US2016/014604, mailed dated 19, 2016.

International Search Report, PCT/US2016/014361, dated May 30, 2016.

International Search Report, PCT/US2016/014356, dated Jun. 28, 2016.

International Search Report, PCT/US2016/014357, dated Jun. 29, 2016.

International Seach Report and the Written Opinion of the International Searching Authority, PCT/US2016/016504, dated Jul. 6, 2016.

International Seach Report and the Written Opinion of the International Searching Authority, PCT/US2016/024391, dated Jul. 12, 2016.

International Seach Report and the Written Opinion of the International Searching Authority, PCT/US2016/026529, dated Jul. 19, 2016.

International Seach Report and the Written Opinion of the International Searching Authority, PCT/US2016/023485, dated Jul. 21, 2016.

International Seach Report and the Written Opinion of the International Searching Authority, PCT/US2016/033306, dated Aug. 19, 2016.

International Seach Report and the Written Opinion of the International Searching Authority, PCT/US2016/047808, dated Nov. 25, 2016.

(56) References Cited

OTHER PUBLICATIONS

Stalzer, Mark A., "FlashBlades: System Architecture and Applications," Proceedings of the 2nd Workshop on Architectures and Systems for Big Data, Association for Computing Machinery, New York, NY, 2012, pp. 10-14.
International Seach Report and the Written Opinion of the International Searching Authority, PCT/US2016/042147, dated Nov. 30, 2016.

* cited by examiner

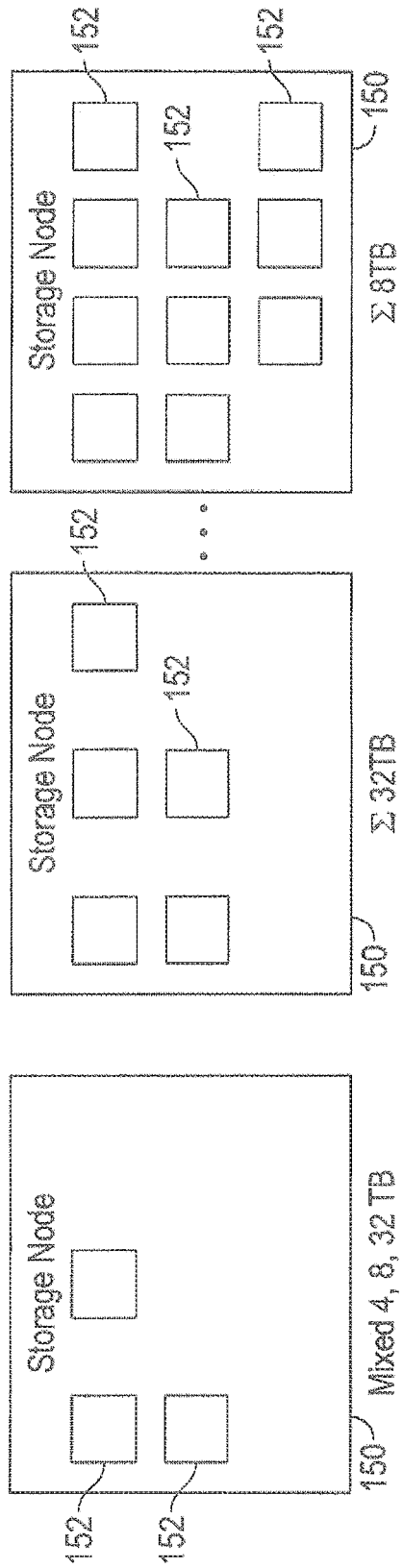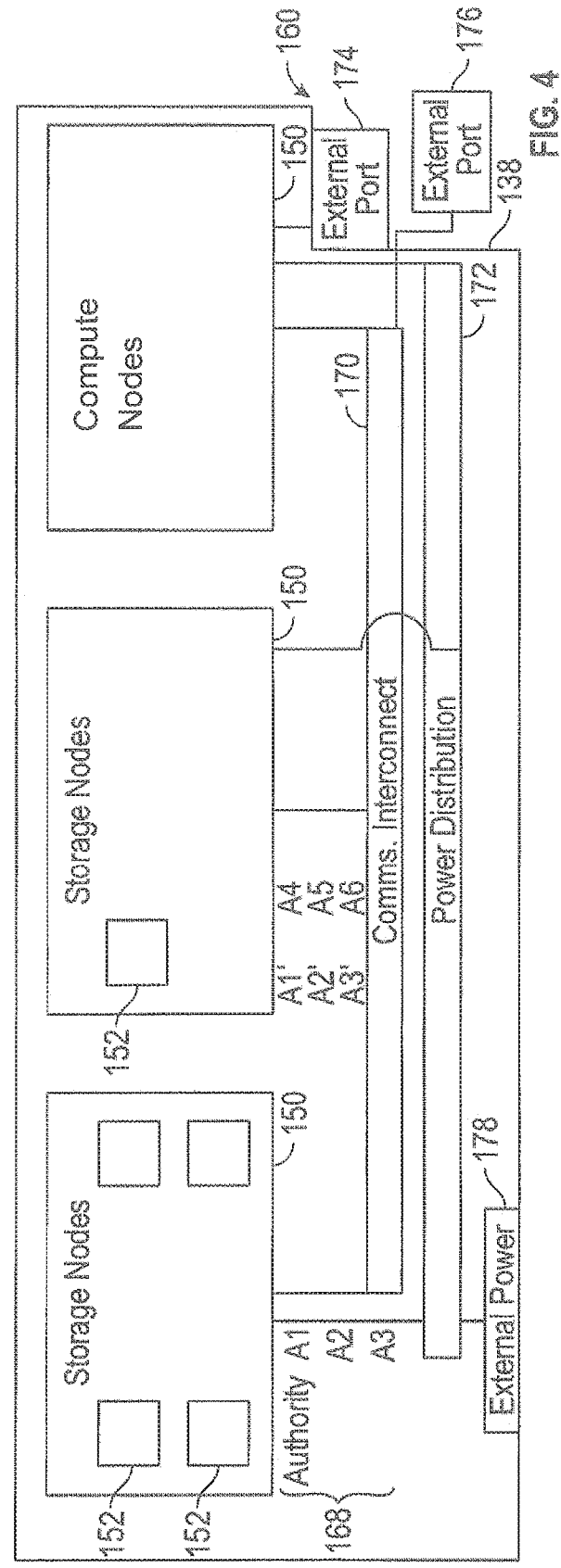

LOAD BALACING FOR DISTIBUTED COMPUTING

BACKGROUND

Solid-state memory, such as flash, is currently in use in solid-state drives (SSD) to augment or replace conventional hard disk drives (HDD), writable CD (compact disk) or writable DVD (digital versatile disk) drives, collectively known as spinning media, and tape drives, for storage of large amounts of data. Flash and other solid-state memories have characteristics that differ from spinning media. Yet, many solid-state drives are designed to conform to hard disk drive standards for compatibility reasons, which makes it difficult to provide enhanced features or take advantage of unique aspects of flash and other solid-state memory. Spinning media are limited in the flexibility or variations of the connections communication paths between the storage units or storage nodes of conventional storage arrays.

It is within this context that the embodiments arise.

SUMMARY

In some embodiments, a storage system is provided. The storage system includes a plurality of storage units, each of the plurality of storage units having storage memory for user data and a plurality of storage nodes, each of the plurality of storage nodes configured to have ownership of a portion of the user data. The storage system includes a first pathway, coupling the plurality of storage units such that each of the plurality of storage units can communicate with at least one other of the plurality of storage units via the first pathway without assistance from the plurality of storage nodes.

In some embodiments, a storage system is provided. The storage system includes a first storage cluster, the first storage cluster having a first plurality of storage nodes coupled together and a second storage cluster, the second storage cluster having a second plurality of storage nodes coupled together. The system includes an interconnect coupling the first storage cluster and the second storage cluster and a first pathway coupling the interconnect to each storage cluster. The system includes a second pathway, the second pathway coupling at least one fabric module within a chassis to each blade within the chassis.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

FIG. 3 is a block diagram showing multiple storage nodes and non-volatile solid state storage with differing capacities, suitable for use in the storage cluster of FIG. 1 in accordance with some embodiments.

FIG. 4 is a block diagram showing an interconnect switch coupling multiple storage nodes in accordance with some embodiments.

DETAILED DESCRIPTION

Figure 1:
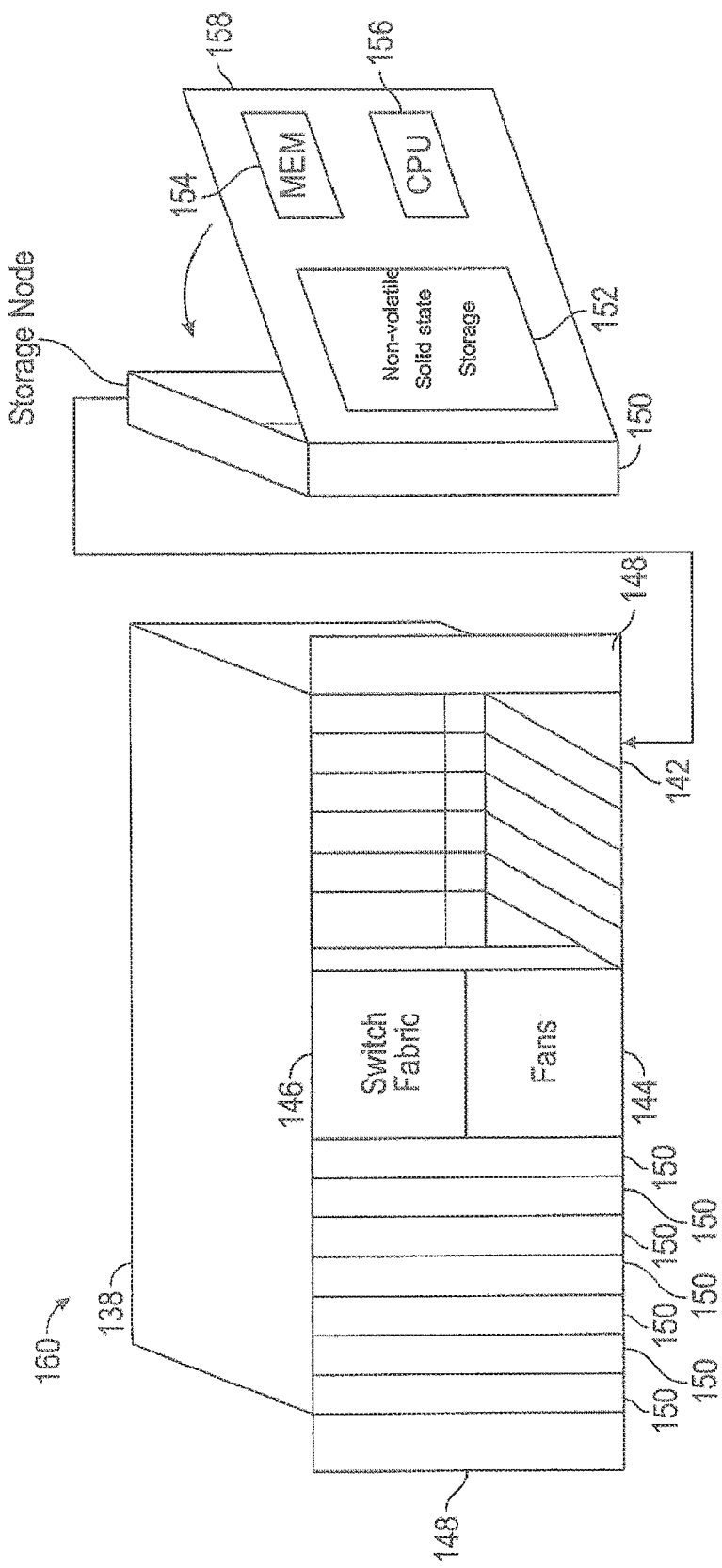
FIG. 1 is a perspective view of a storage cluster with multiple storage nodes and internal storage coupled to each storage node to provide network attached storage, in accordance with some embodiments.

The embodiments below describe a storage cluster that stores user data, such as user data originating from one or more user or client systems or other sources external to the storage cluster. The storage cluster distributes user data across storage nodes housed within a chassis, using erasure coding and redundant copies of metadata. Erasure coding refers to a method of data protection or reconstruction in which data is stored across a set of different locations, such as disks, storage nodes or geographic locations. Flash memory is one type of solid-state memory that may be integrated with the embodiments, although the embodiments may be extended to other types of solid-state memory or other storage medium, including non-solid state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server.

The storage cluster is contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of both the power distribution and the communication bus which may be enabled or disabled independently. The internal communication bus may be an Ethernet bus, however, other technologies such as Peripheral Component Interconnect (PCI) Express, InfiniBand, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system (NFS), common internet file system (CIFS), small computer system interface (SCSI) or hypertext transfer protocol (HTTP). Translation from the client protocol may occur at the switch, chassis external communication bus or within each storage node.

Each storage node may be one or more storage servers and each storage server is connected to one or more non-volatile solid state memory units, which may be referred to as storage units. One embodiment includes a single storage server in each storage node and between one to eight non-volatile solid state memory units, however this one example is not meant to be limiting. The storage server may include a processor, dynamic random access memory (DRAM) and interfaces for the internal communication bus and power distribution for each of the power buses. Inside the storage node, the interfaces and storage unit share a communication bus, e.g., PCI Express, in some embodiments. The non-volatile solid state memory units may directly access the internal communication bus interface through a storage node communication bus, or request the storage node to access the bus interface. The non-volatile solid state memory unit contains an embedded central processing unit (CPU), solid state storage controller, and a quantity of solid state mass storage, e.g., between 2-32 terabytes (TB) in some embodiments. An embedded volatile storage medium, such as DRAM, and an energy reserve apparatus are included in the non-volatile solid state memory unit. In some embodiments, the energy reserve apparatus is a capacitor, super-capacitor, or battery that enables transferring a subset of DRAM contents to a stable storage medium in the case of power loss. In some embodiments, the non-volatile solid state memory unit is constructed with a storage class memory, such as phase change or magnetoresistive random access memory (MRAM) that substitutes for DRAM and enables a reduced power hold-up apparatus.

One of many features of the storage nodes and non-volatile solid state storage is the ability to proactively rebuild data in a storage cluster. The storage nodes and non-volatile solid state storage can determine when a storage node or non-volatile solid state storage in the storage cluster is unreachable, independent of whether there is an attempt to read data involving that storage node or non-volatile solid state storage. The storage nodes and non-volatile solid state storage then cooperate to recover and rebuild the data in at least partially new locations. This constitutes a proactive rebuild, in that the system rebuilds data without waiting until the data is needed for a read access initiated from a client system employing the storage cluster. These and further details of the storage memory and operation thereof are discussed below.

FIG. 1 is a perspective view of a storage cluster 160, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 160, each having one or more storage nodes 150, in a flexible and reconfigurable arrangement of both the physical components and the amount of storage memory provided thereby. The storage cluster 160 is designed to fit in a rack, and one or more racks can be set up and populated as desired for the storage memory. The storage cluster 160 has a chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in FIG. 1, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 158 populated by a CPU 156, i.e., processor, a memory 154 coupled to the CPU 156, and a non-volatile solid state storage 152 coupled to the CPU 156, although other mountings and/or components could be used in further embodiments. The memory 154 has instructions which are executed by the CPU 156 and/or data operated on by the CPU 156. As further explained below, the non-volatile solid state storage 152 includes flash or, in further embodiments, other types of solid-state memory.

Figure 2:
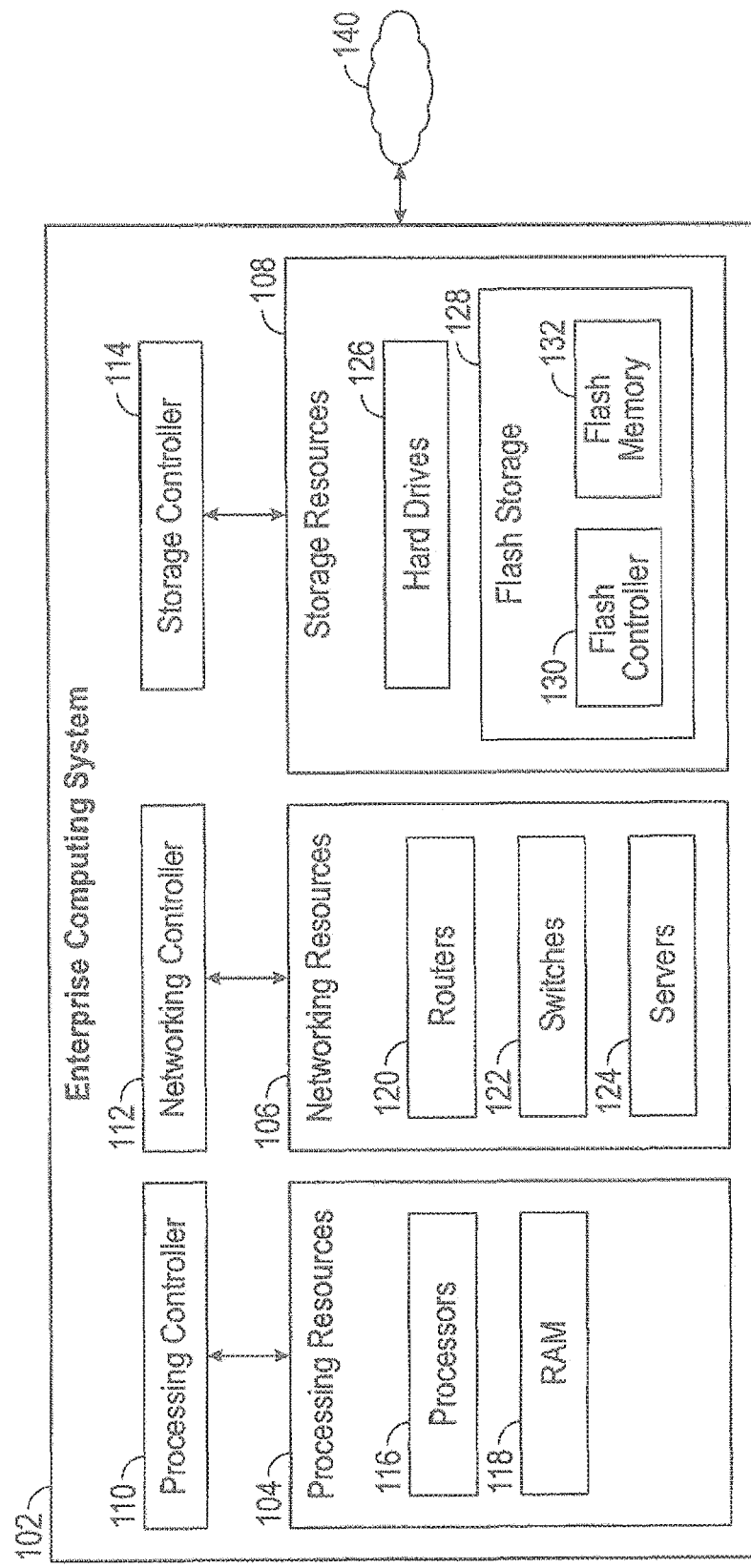
FIG. 2 is a system diagram of an enterprise computing system, which can use one or more of the storage clusters of FIG. 1 as a storage resource in some embodiments.

FIG. 2 is a system diagram of an enterprise computing system 102, which can use one or more of the storage nodes, storage clusters and/or non-volatile solid state storage of FIG. 1 as a storage resource 108. For example, flash storage 128 of FIG. 2 may integrate the storage nodes, storage clusters and/or non-volatile solid state storage of FIG. 1 in some embodiments. The enterprise computing system 102 has processing resources 104, networking resources 106 and storage resources 108, including flash storage 128. A flash controller 130 and flash memory 132 are included in the flash storage 128. In various embodiments, the flash storage 128 could include one or more storage nodes or storage clusters, with the flash controller 130 including the CPUs, and the flash memory 132 including the non-volatile solid state storage of the storage nodes. In some embodiments flash memory 132 may include different types of flash memory or the same type of flash memory. The enterprise computing system 102 illustrates an environment suitable for deployment of the flash storage 128, although the flash storage 128 could be used in other computing systems or devices, larger or smaller, or in variations of the enterprise computing system 102, with fewer or additional resources. The enterprise computing system 102 can be coupled to a network 140, such as the Internet, in order to provide or make use of services. For example, the enterprise computing system 102 could provide cloud services, physical computing resources, or virtual computing services.

In the enterprise computing system 102, various resources are arranged and managed by various controllers. A processing controller 110 manages the processing resources 104, which include processors 116 and random-access memory (RAM) 118. Networking controller 112 manages the networking resources 106, which include routers 120, switches 122, and servers 124. A storage controller 114 manages storage resources 108, which include hard drives 126 and flash storage 128. Other types of processing resources, networking resources, and storage resources could be included with the embodiments. In some embodiments, the flash storage 128 completely replaces the hard drives 126. The enterprise computing system 102 can provide or allocate the various resources as physical computing resources, or in variations, as virtual computing resources supported by physical computing resources. For example, the various resources could be implemented using one or more servers executing software. Files or data objects, or other forms of data, are stored in the storage resources 108.

In various embodiments, an enterprise computing system 102 could include multiple racks populated by storage clusters, and these could be located in a single physical location such as in a cluster or a server farm. In other embodiments the multiple racks could be located at multiple physical locations such as in various cities, states or countries, connected by a network. Each of the racks, each of the storage clusters, each of the storage nodes, and each of the non-volatile solid state storage could be individually configured with a respective amount of storage space, which is then reconfigurable independently of the others. Storage capacity can thus be flexibly added, upgraded, subtracted, recovered and/or reconfigured at each of the non-volatile solid state storages. As mentioned previously, each storage node could implement one or more servers in some embodiments.

FIG. 3 is a block diagram showing multiple storage nodes 150 and non-volatile solid state storage 152 with differing capacities, suitable for use in the chassis of FIG. 1. Each storage node 150 can have one or more units of non-volatile solid state storage 152. Each non-volatile solid state storage 152 may include differing capacity from other non-volatile solid state storage 152 on a storage node 150 or in other storage nodes 150 in some embodiments. Alternatively, all of the non-volatile solid state storages 152 on a storage node or on multiple storage nodes can have the same capacity or combinations of the same and/or differing capacities. This flexibility is illustrated in FIG. 3, which shows an example of one storage node 150 having mixed non-volatile solid state storage 152 of four, eight and thirty-two TB capacity, another storage node 150 having non-volatile solid state storage 152 each of thirty-two TB capacity, and still another storage node having non-volatile solid state storage 152 each of eight TB capacity. Various further combinations and capacities are readily devised in accordance with the teachings herein. In the context of clustering, e.g., clustering storage to form a storage cluster, a storage node can be or include a non-volatile solid state storage 152. Non-volatile solid state storage 152 is a convenient clustering point as the non-volatile solid state storage 152 may include a non-volatile random access memory (NVRAM) component, as will be further described below.

Referring to FIGS. 1 and 3, storage cluster 160 is scalable, meaning that storage capacity with non-uniform storage sizes is readily added, as described above. One or more storage nodes 150 can be plugged into or removed from each chassis and the storage cluster self-configures in some embodiments. Plug-in storage nodes 150, whether installed in a chassis as delivered or later added, can have different sizes. For example, in one embodiment a storage node 150 can have any multiple of 4 TB, e.g., 8 TB, 12 TB, 16 TB, 32 TB, etc. In further embodiments, a storage node 150 could have any multiple of other storage amounts or capacities. Storage capacity of each storage node 150 is broadcast, and influences decisions of how to stripe the data. For maximum storage efficiency, an embodiment can self-configure as wide as possible in the stripe, subject to a predetermined requirement of continued operation with loss of up to one, or up to two, non-volatile solid state storage units 152 or storage nodes 150 within the chassis.

FIG. 4 is a block diagram showing a communications interconnect 170 and power distribution bus 172 coupling multiple storage nodes 150. Referring back to FIG. 1, the communications interconnect 170 can be included in or implemented with the switch fabric 146 in some embodiments. Where multiple storage clusters 160 occupy a rack, the communications interconnect 170 can be included in or implemented with a top of rack switch, in some embodiments. As illustrated in FIG. 4, storage cluster 160 is enclosed within a single chassis 138. External port 176 is coupled to storage nodes 150 through communications interconnect 170, while external port 174 is coupled directly to a storage node. External power port 178 is coupled to power distribution bus 172. Storage nodes 150 may include varying amounts and differing capacities of non-volatile solid state storage 152 as described with reference to FIG. 3. In addition, one or more storage nodes 150 may be a compute only storage node as illustrated in FIG. 4. A compute only storage node 150 performs computing functions for the storage cluster 160, or functions as a compute node to perform computing functions and/or execute applications, which may make use of user data destined for, stored in, or retrieved from the non-volatile solid state storages 152 in the storage cluster 160, in various embodiments. Authorities 168 are implemented on the non-volatile solid state storages 152, for example as lists or other data structures stored in memory. In some embodiments the authorities are stored within the non-volatile solid state storage 152 and supported by software executing on a controller or other processor of the non-volatile solid state storage 152. In a further embodiment, authorities 168 are implemented on the storage nodes 150, for example as lists or other data structures stored in the memory 154 and supported by software executing on the CPU 156 of the storage node 150. Authorities 168 control how and where data is stored in the non-volatile solid state storages 152 in some embodiments. This control assists in determining which type of erasure coding scheme is applied to the data, and which storage nodes 150 have which portions of the data. Each authority 168 may be assigned to a non-volatile solid state storage 152. Each authority may control a range of inode numbers, segment numbers, or other data identifiers which are assigned to data by a file system, by the storage nodes 150, or by the non-volatile solid state storage 152, in various embodiments.

Every piece of data, and every piece of metadata, has redundancy in the system in some embodiments. In addition, every piece of data and every piece of metadata has an owner, which may be referred to as an authority, or in some versions a ward, with an authority being a group or set of wards. If that authority is unreachable, for example through failure of a storage node, there is a plan of succession for how to find that data or that metadata. In various embodiments, there are redundant copies of authorities 168. Authorities 168 have a relationship to storage nodes 150 and non-volatile solid state storage 152 in some embodiments. Each authority 168 (and thus each group of wards, in embodiments where an authority is a group of wards), covering a range of data segment numbers or other identifiers of the data, may be assigned to a specific non-volatile solid state storage 152. In some embodiments the authorities 168 for all of such ranges are distributed over the non-volatile solid state storages 152 of a storage cluster. Each storage node 150 has a network port that provides access to the non-volatile solid state storage(s) 152 of that storage node 150. Data can be stored in a segment, which is associated with a segment number and that segment number is an indirection for a configuration of a RAID (redundant array of independent disks) stripe in some embodiments. The assignment and use of the authorities 168 (and wards, where applicable) thus establishes an indirection to data. Indirection may be referred to as the ability to reference data indirectly, in this case via an authority 168, in accordance with some embodiments. A segment identifies a set of non-volatile solid state storage 152 and a local identifier into the set of non-volatile solid state storage 152 that may contain data. In some embodiments, the local identifier is an offset into the device and may be reused sequentially by multiple segments. In other embodiments the local identifier is unique for a specific segment and never reused. The offsets in the non-volatile solid state storage 152 are applied to locating data for writing to or reading from the non-volatile solid state storage 152 (in the form of a RAID stripe). Data is striped across multiple units of non-volatile solid state storage 152, which may include or be different from the non-volatile solid state storage 152 having the authority 168 for a particular data segment.

If there is a change in where a particular segment of data is located, e.g., during a data move or a data reconstruction, the authority 168 for that data segment should be consulted, at that non-volatile solid state storage 152 or storage node 150 having that authority 168. In order to locate a particular piece of data, embodiments calculate a hash value for a data segment or apply an inode number or a data segment number. The output of this operation points to a non-volatile solid state storage 152 having the authority 168 for that particular piece of data. In some embodiments there are two stages to this operation. The first stage maps an entity identifier (ID), e.g., a segment number, inode number, or directory number to an authority identifier. This mapping may include a calculation such as a hash or a bit mask. The second stage is mapping the authority identifier to a particular non-volatile solid state storage 152, which may be done through an explicit mapping. The operation is repeatable, so that when the calculation is performed, the result of the calculation repeatably and reliably points to a particular non-volatile solid state storage 152 having that authority 168. The operation may include the set of reachable storage nodes as input. If the set of reachable non-volatile solid state storage units changes the optimal set changes. In some embodiments, the persisted value is the current assignment (which is always true) and the calculated value is the target assignment the cluster will attempt to reconfigure towards. This calculation may be used to determine the optimal non-volatile solid state storage 152 for an authority in the presence of a set of non-volatile solid state storage 152 that are reachable and constitute the same cluster. The calculation also determines an ordered set of peer non-volatile solid state storage 152 that will also record the authority to non-volatile solid state storage mapping so that the authority may be determined even if the assigned non-volatile solid state storage is unreachable. A duplicate or substitute authority 168 may be consulted if a specific authority 168 is unavailable in some embodiments.

With reference to FIGS. 1-4, two of the many tasks of the CPU 156 on a storage node 150 are to break up write data, and reassemble read data. When the system has determined that data is to be written, the authority 168 for that data is located as above. When the segment ID for data is already determined the request to write is forwarded to the non-volatile solid state storage 152 currently determined to be the host of the authority 168 determined from the segment. The host CPU 156 of the storage node 150, on which the non-volatile solid state storage 152 and corresponding authority 168 reside, then breaks up or shards the data and transmits the data out to various non-volatile solid state storage 152. The transmitted data is written as a data stripe in accordance with an erasure coding scheme. In some embodiments, data is requested to be pulled, and in other embodiments, data is pushed. In reverse, when data is read, the authority 168 for the segment ID containing the data is located as described above. The host CPU 156 of the storage node 150 on which the non-volatile solid state storage 152 and corresponding authority 168 reside requests the data from the non-volatile solid state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid state storage 152. In some embodiments, the segment host requests the data be sent to storage node 150 by requesting pages from storage and then sending the data to the storage node making the original request.

In some systems, for example in UNIX-style file systems, data is handled with an index node or inode, which specifies a data structure that represents an object in a file system. The object could be a file or a directory, for example. Metadata may accompany the object, as attributes such as permission data and a creation timestamp, among other attributes. A segment number could be assigned to all or a portion of such an object in a file system. In other systems, data segments are handled with a segment number assigned elsewhere. For purposes of discussion, the unit of distribution is an entity, and an entity can be a file, a directory or a segment. That is, entities are units of data or metadata stored by a storage system. Entities are grouped into sets called authorities. Each authority has an authority owner, which is a storage node that has the exclusive right to update the entities in the authority. In other words, a storage node contains the authority, and that the authority, in turn, contains entities.

A segment is a logical container of data in accordance with some embodiments. A segment is an address space between medium address space and physical flash locations, i.e., the data segment number, are in this address space. Segments may also contain meta-data, which enable data redundancy to be restored (rewritten to different flash locations or devices) without the involvement of higher level software. In one embodiment, an internal format of a segment contains client data and medium mappings to determine the position of that data. Each data segment is protected, e.g., from memory and other failures, by breaking the segment into a number of data and parity shards, where applicable. The data and parity shards are distributed, i.e., striped, across non-volatile solid state storage 152 coupled to the host CPUs 156 (See FIG. 5) in accordance with an erasure coding scheme. Usage of the term segments refers to the container and its place in the address space of segments in some embodiments. Usage of the term stripe refers to the same set of shards as a segment and includes how the shards are distributed along with redundancy or parity information in accordance with some embodiments.

A series of address-space transformations takes place across an entire storage system. At the top is the directory entries (file names) which link to an inode. Inodes point into medium address space, where data is logically stored. Medium addresses may be mapped through a series of indirect mediums to spread the load of large files, or implement data services like deduplication or snapshots. Medium addresses may be mapped through a series of indirect mediums to spread the load of large files, or implement data services like deduplication or snapshots. Segment addresses are then translated into physical flash locations. Physical flash locations have an address range bounded by the amount of flash in the system in accordance with some embodiments. Medium addresses and segment addresses are logical containers, and in some embodiments use a 128 bit or larger identifier so as to be practically infinite, with a likelihood of reuse calculated as longer than the expected life of the system. Addresses from logical containers are allocated in a hierarchical fashion in some embodiments. Initially, each non-volatile solid state storage 152 may be assigned a range of address space. Within this assigned range, the non-volatile solid state storage 152 is able to allocate addresses without synchronization with other non-volatile solid state storage 152.

Data and metadata is stored by a set of underlying storage layouts that are optimized for varying workload patterns and storage devices. These layouts incorporate multiple redundancy schemes, compression formats and index algorithms. Some of these layouts store information about authorities and authority masters, while others store file metadata and file data. The redundancy schemes include error correction codes that tolerate corrupted bits within a single storage device (such as a NAND flash chip), erasure codes that tolerate the failure of multiple storage nodes, and replication schemes that tolerate data center or regional failures. In some embodiments, low density parity check (LDPC) code is used within a single storage unit. Reed-Solomon encoding is used within a storage cluster, and mirroring is used within a storage grid in some embodiments. Metadata may be stored using an ordered log structured index (such as a Log Structured Merge Tree), and large data may not be stored in a log structured layout.

In order to maintain consistency across multiple copies of an entity, the storage nodes agree implicitly on two things through calculations: (1) the authority that contains the entity, and (2) the storage node that contains the authority. The assignment of entities to authorities can be done by pseudorandomly assigning entities to authorities, by splitting entities into ranges based upon an externally produced key, or by placing a single entity into each authority. Examples of pseudorandom schemes are linear hashing and the Replication Under Scalable Hashing (RUSH) family of hashes, including Controlled Replication Under Scalable Hashing (CRUSH). In some embodiments, pseudo-random assignment is utilized only for assigning authorities to nodes because the set of nodes can change. The set of authorities cannot change so any subjective function may be applied in these embodiments. Some placement schemes automatically place authorities on storage nodes, while other placement schemes rely on an explicit mapping of authorities to storage nodes. In some embodiments, a pseudorandom scheme is utilized to map from each authority to a set of candidate authority owners. A pseudorandom data distribution function related to CRUSH may assign authorities to storage nodes and create a list of where the authorities are assigned. Each storage node has a copy of the pseudorandom data distribution function, and can arrive at the same calculation for distributing, and later finding or locating an authority. Each of the pseudorandom schemes requires the reachable set of storage nodes as input in some embodiments in order to conclude the same target nodes. Once an entity has been placed in an authority, the entity may be stored on physical devices so that no expected failure will lead to unexpected data loss. In some embodiments, rebalancing algorithms attempt to store the copies of all entities within an authority in the same layout and on the same set of machines.

Examples of expected failures include device failures, stolen machines, datacenter fires, and regional disasters, such as nuclear or geological events. Different failures lead to different levels of acceptable data loss. In some embodiments, a stolen storage node impacts neither the security nor the reliability of the system, while depending on system configuration, a regional event could lead to no loss of data, a few seconds or minutes of lost updates, or even complete data loss.

In the embodiments, the placement of data for storage redundancy is independent of the placement of authorities for data consistency. In some embodiments, storage nodes that contain authorities do not contain any persistent storage. Instead, the storage nodes are connected to non-volatile solid state storage units that do not contain authorities. The communications interconnect between storage nodes and non-volatile solid state storage units consists of multiple communication technologies and has non-uniform performance and fault tolerance characteristics. In some embodiments, as mentioned above, non-volatile solid state storage units are connected to storage nodes via PCI express, storage nodes are connected together within a single chassis using Ethernet backplane, and chassis are connected together to form a storage cluster. Storage clusters are connected to clients using Ethernet or fiber channel in some embodiments. If multiple storage clusters are configured into a storage grid, the multiple storage clusters are connected using the Internet or other long-distance networking links, such as a "metro scale" link or private link that does not traverse the internet.

Authority owners have the exclusive right to modify entities, to migrate entities from one non-volatile solid state storage unit to another non-volatile solid state storage unit, and to add and remove copies of entities. This allows for maintaining the redundancy of the underlying data. When an authority owner fails, is going to be decommissioned, or is overloaded, the authority is transferred to a new storage node. Transient failures make it non-trivial to ensure that all non-faulty machines agree upon the new authority location. The ambiguity that arises due to transient failures can be achieved automatically by a consensus protocol such as Paxos, hot-warm failover schemes, via manual intervention by a remote system administrator, or by a local hardware administrator (such as by physically removing the failed machine from the cluster, or pressing a button on the failed machine). In some embodiments, a consensus protocol is used, and failover is automatic. If too many failures or replication events occur in too short a time period, the system goes into a self-preservation mode and halts replication and data movement activities until an administrator intervenes in accordance with some embodiments.

As authorities are transferred between storage nodes and authority owners update entities in their authorities, the system transfers messages between the storage nodes and non-volatile solid state storage units. With regard to persistent messages, messages that have different purposes are of different types. Depending on the type of the message, the system maintains different ordering and durability guarantees. As the persistent messages are being processed, the messages are temporarily stored in multiple durable and non-durable storage hardware technologies. In some embodiments, messages are stored in RAM, NVRAM and on NAND flash devices, and a variety of protocols are used in order to make efficient use of each storage medium. Latency-sensitive client requests may be persisted in replicated NVRAM, and then later NAND, while background rebalancing operations are persisted directly to NAND.

Persistent messages are persistently stored prior to being replicated. This allows the system to continue to serve client requests despite failures and component replacement. Although many hardware components contain unique identifiers that are visible to system administrators, manufacturer, hardware supply chain and ongoing monitoring quality control infrastructure, applications running on top of the infrastructure address virtualize addresses. These virtualized addresses do not change over the lifetime of the storage system, regardless of component failures and replacements. This allows each component of the storage system to be replaced over time without reconfiguration or disruptions of client request processing.

In some embodiments, the virtualized addresses are stored with sufficient redundancy. A continuous monitoring system correlates hardware and software status and the hardware identifiers. This allows detection and prediction of failures due to faulty components and manufacturing details. The monitoring system also enables the proactive transfer of authorities and entities away from impacted devices before failure occurs by removing the component from the critical path in some embodiments.

Figure 5:
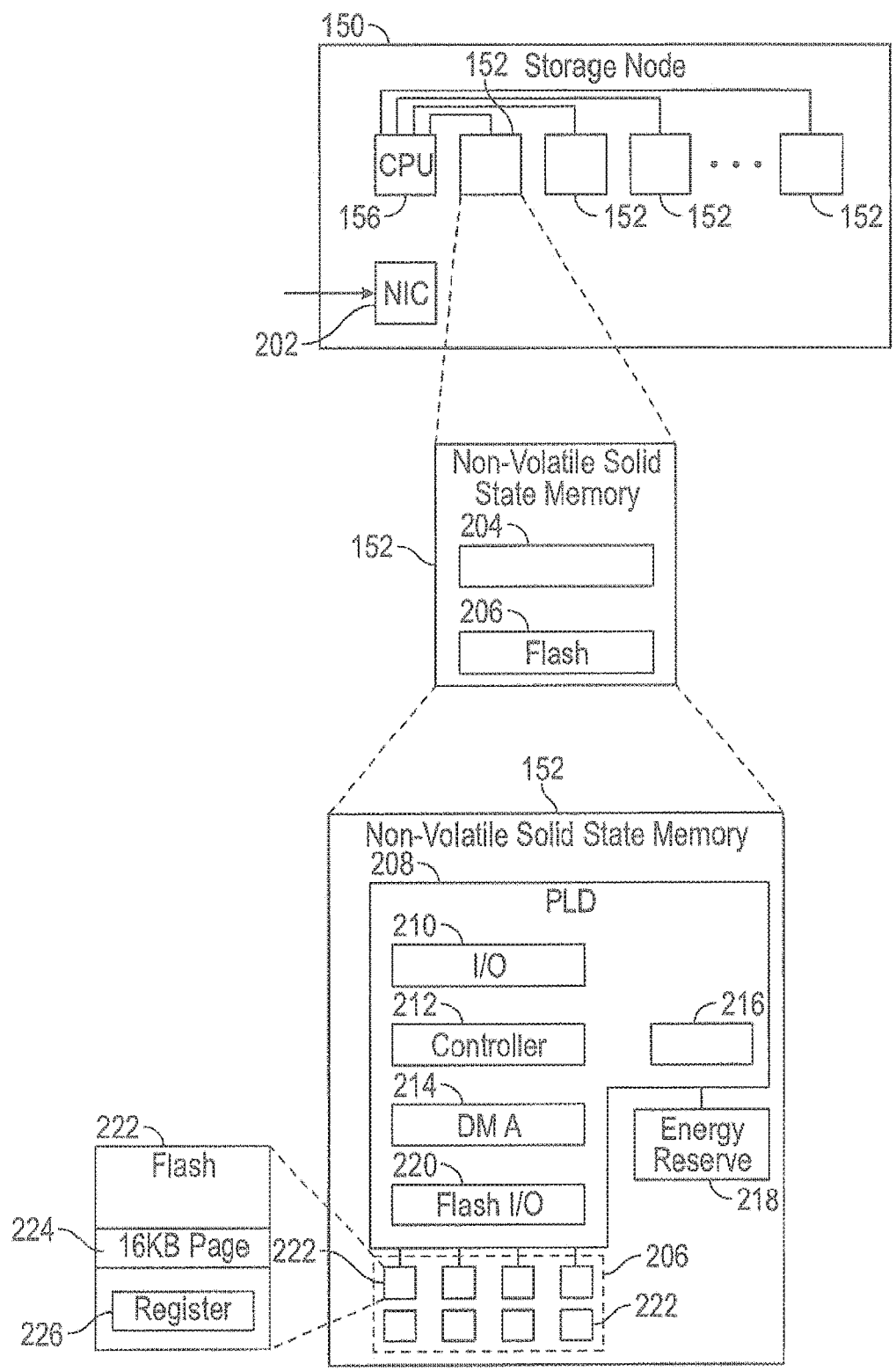
FIG. 5 is a multiple level block diagram, showing contents of a storage node and contents of one of the non-volatile solid state storage units in accordance with some embodiments.

FIG. 5 is a multiple level block diagram, showing contents of a storage node 150 and contents of a non-volatile solid state storage 152 of the storage node 150. Data is communicated to and from the storage node 150 by a network interface controller (NIC) 202 in some embodiments. Each storage node 150 has a CPU 156, and one or more non-volatile solid state storage 152, as discussed above. Moving down one level in FIG. 5, each non-volatile solid state storage 152 has a relatively fast non-volatile solid state memory, such as nonvolatile random access memory (NVRAM) 204, and flash memory 206. In some embodiments, NVRAM 204 may be a component that does not require program/erase cycles (DRAM, MRAM, PCM), and can be a memory that can support being written vastly more often than the memory is read from. Moving down another level in FIG. 5, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e. multichip packages), in hybrid packages, as bare dies on a printed circuit board or other substrate, as encapsulated dies, etc. In the embodiment shown, the non-volatile solid state storage 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device (PLD) 208, e.g., a field programmable gate array (FPGA). In this embodiment, each flash die 222 has pages, organized as sixteen kB (kilobyte) pages 224, and a register 226 through which data can be written to or read from the flash die 222. In further embodiments, other types of solid-state memory are used in place of, or in addition to flash memory illustrated within flash die 222.

Figure 6A:
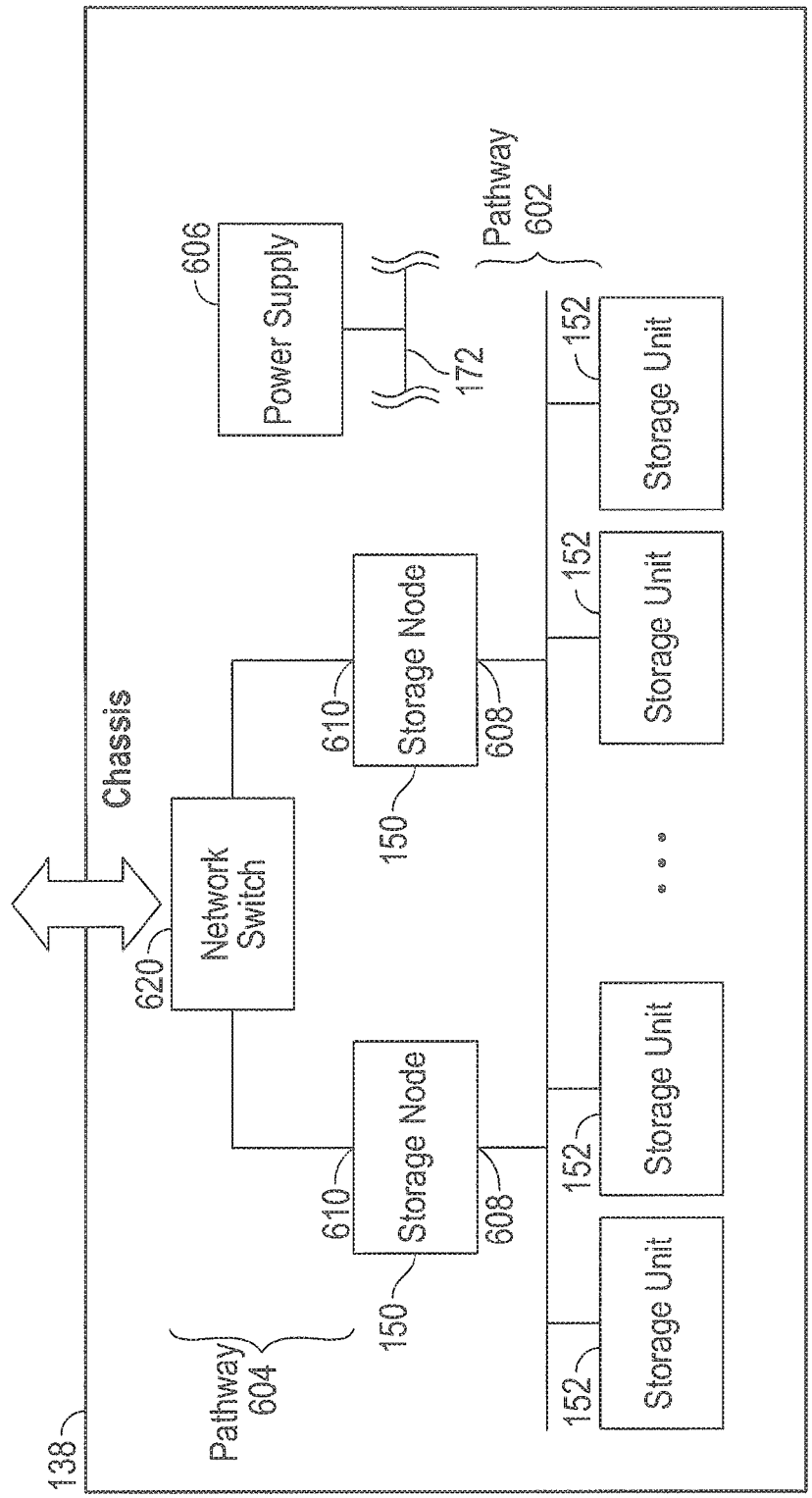
FIG. 6A is a block diagram of a further embodiment of the storage cluster having one example of connectivity between and within storage nodes and storage units in accordance with some embodiments.

FIG. 6A is a block diagram of a further embodiment of the storage cluster 160 of FIGS. 1-5. In this embodiment, the components are in a chassis 138, such as the chassis 138 with multiple slots shown in FIG. 1. A power supply 606, with a power distribution bus 172 (as seen in FIG. 2), provides electrical power to the various components in the chassis 138. Two storage nodes 150 are shown coupled to a pathway 604, such as a network switch 620 in one embodiment. Further pathways are readily devised. The pathway 604 couples the storage nodes 150 to each other, and can also couple the storage nodes 150 to a network external to the chassis 138, allowing connection to external devices, systems or networks.

Multiple storage units 152 are coupled to each other and to the storage nodes 150 by another pathway 602, which is distinct from the network switch 620 or other pathway 604 coupling the storage nodes 150. In one embodiment, the pathway 602 that couples the storage units 152 and the storage nodes 150 is a PCI Express bus (PCIe), although other busses, networks and various further couplings could be used. In some embodiments, there is transparent bridging for the storage node 150 to couple to the pathway 602, e.g., to the PCI Express bus.

In order to connect to the two pathways 602, 604, each storage node 150 has two ports 608, 610. One of the ports 610 of each storage node 150 couples to one of the pathways 604, the other port 608 of each storage node 150 couples to the other pathway 602.

In some embodiments, each of the storage nodes 150 can perform compute functions as a compute node. For example, a storage node 150 could run one or more applications. Further, the storage nodes 150 can communicate with the storage units 152, via the pathway 602, to write and read user data (e.g., using erasure coding) as described with reference to FIGS. 1-3 above. As another example, a storage node 150 executing one or more applications could make use of the user data, generating user data for storage in the storage units 152, reading and processing the user data from the storage units 152, etc. Even with loss of one of the storage units 152, or in some embodiments, loss of two of the storage units 152, the storage nodes 150 and/or remaining storage units 152 can still read the user data.

In some embodiments, the erasure coding functions are performed mostly or entirely in the storage units 152, which frees up the computing power of the storage nodes 150. This allows the storage nodes 150 to focus more on compute node duties, such as executing one or more applications. In some embodiments, the erasure coding functions are performed mostly or entirely in the storage nodes 150. This allows the storage nodes 150 to focus more on storage node duties. In some embodiments, the erasure coding functions are shared across the storage nodes 150 and the storage units 152. This allows the storage nodes 150 to have available computing bandwidth shared between compute node duties and storage node duties.

With the two pathways 602, 604 being distinct from each other, several advantages become apparent. Neither pathway 602, 604 becomes a bottleneck, as might happen if there were only one pathway coupling the storage nodes 150 and the storage units 152 to each other and to an external network. With only one pathway, a hostile could gain direct access to the storage units 152 without having to go through a storage node 150. With two pathways 602, 604, the storage nodes 150 can couple to each other through one pathway 604, e.g., for multiprocessing applications or for interprocessor communication. The other pathway 602 can be used by either of the storage nodes 150 for data access in the storage units 152. The architecture shown in FIG. 6A thus supports various storage and computing functions and scenarios. Particularly, one embodiment as shown in FIG. 6A is a storage and computing system in a single chassis 138. Processing power, in the form of one or more storage nodes 150, and storage capacity, in the form of one or more storage units 152, can be added readily to the chassis 138 as storage and/or computing needs change.

Figure 6B:
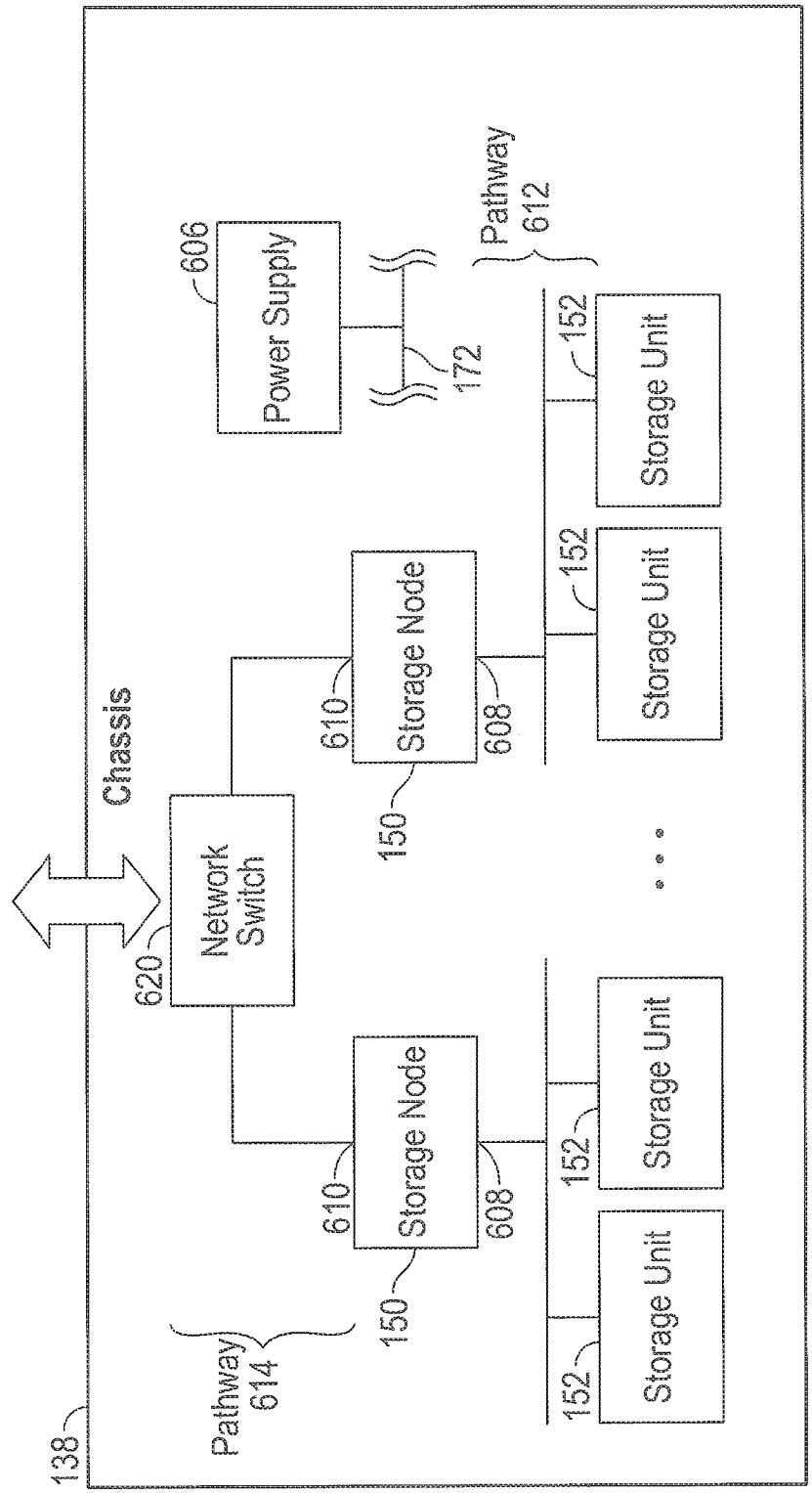
FIG. 6B is a variation of the connectivity within the storage cluster of FIG. 6A in accordance with some embodiments.

FIG. 6B is a variation of the storage cluster 160 of FIG. 6A. In this version, the pathway 612 has portions specific to storage units 152 included in each storage node 150. In one embodiment, the pathway 612 is implemented as a PCI Express bus coupling together storage units 152 and the storage node 150. That is, the storage node 150 and storage units 152 in one blade share a PCI Express bus in some embodiments. The PCI Express bus is specific to the blade, and is not coupled directly to the PCI Express bus of another blade. Accordingly, storage units 152 in a blade can communicate with each other and with the storage node 150 in that blade. Communication from a storage unit 152 or a storage node 150 in one blade to a storage node 150 or storage unit 152 in another blade occurs via the network switch 620, e.g., the pathway 614.

Figure 7:
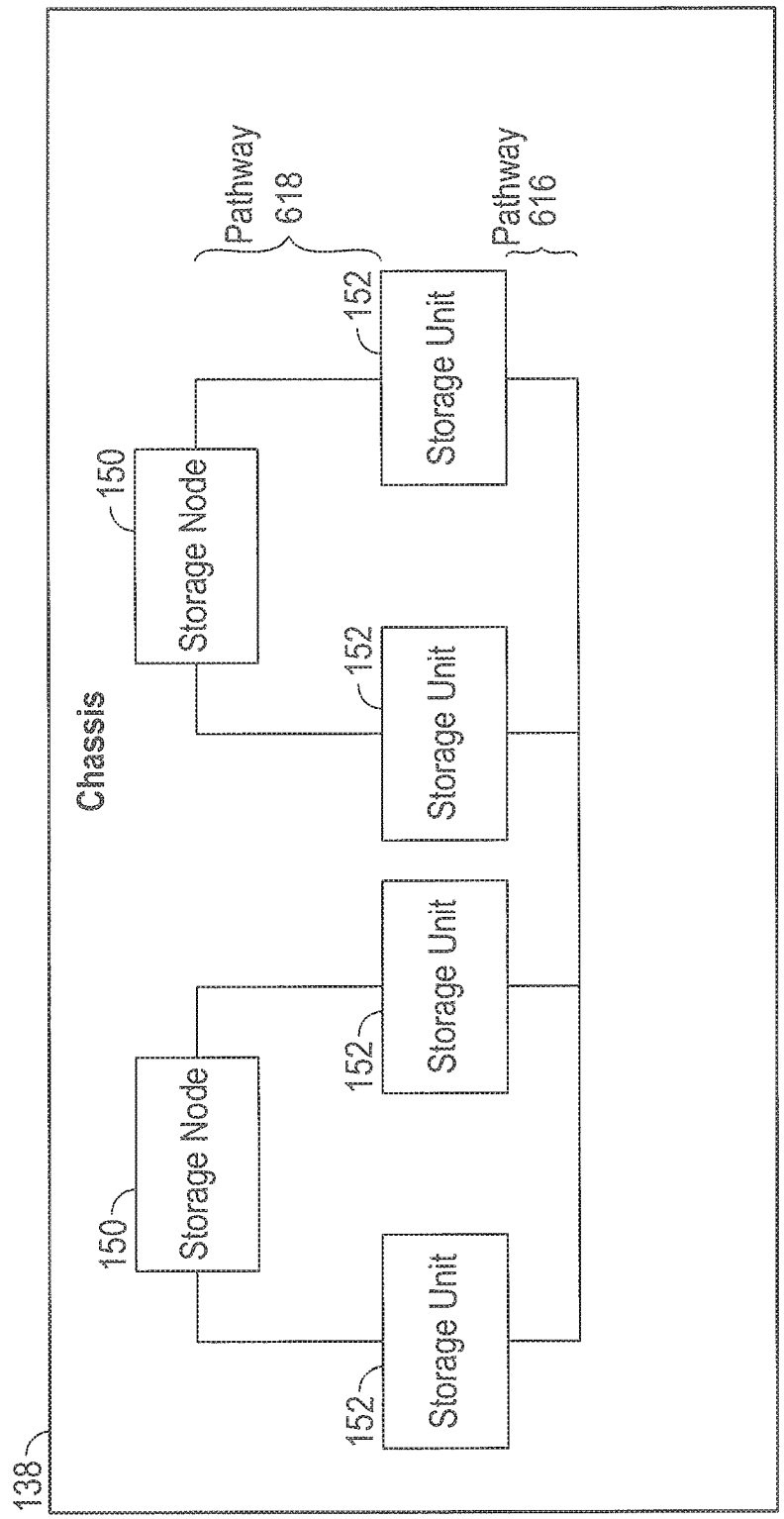
FIG. 7 is a block diagram of a further embodiment of the storage cluster of FIGS. 1-5, suitable for data storage or a combination of data storage and computing in accordance with some embodiments.

FIG. 7 is a block diagram of a further embodiment of the storage cluster 160 of FIGS. 1-5, suitable for data storage or a combination of data storage and computing. The version of FIG. 7 has all of the storage units 152 coupled together by a first pathway 616, which could be a bus, a network or a hardwired mesh, among other possibilities. One storage node 150 is coupled to each of two storage units 152. Another storage unit 152 is coupled to each of two further storage units 152. The coupling from the storage nodes 150 to storage units 152 illustrates a second pathway 618.

Figure 8A:
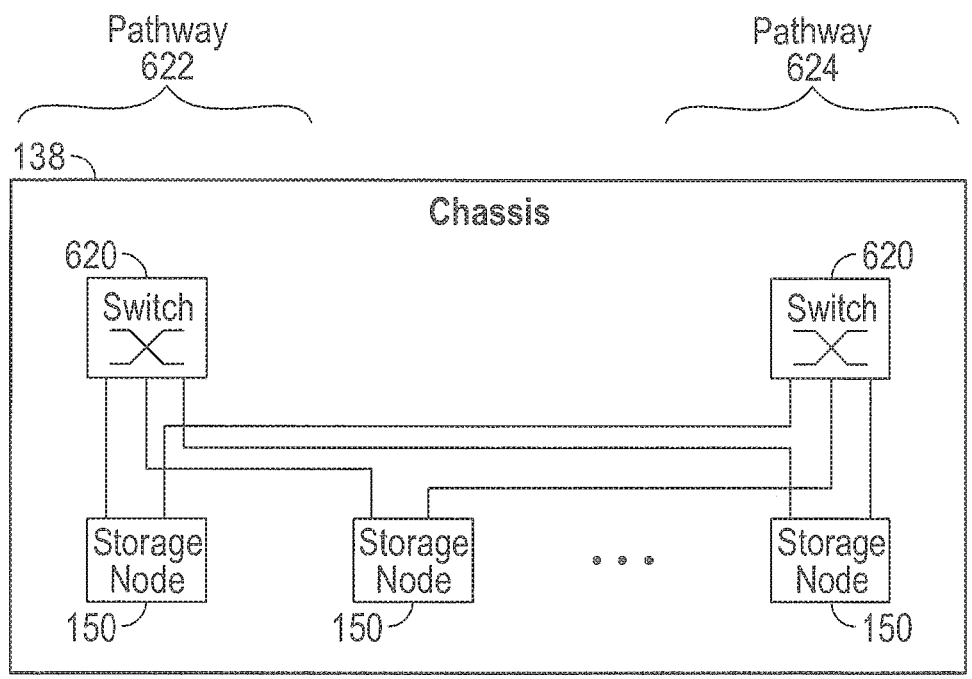
FIG. 8A is a block diagram of a further embodiment of connectivity within the storage cluster of FIGS. 1-5, with switches in accordance with some embodiments.

FIG. 8A is a block diagram of a further embodiment of the storage cluster 160 of FIGS. 1-5, with switches 620. One switch 620 couples all of the storage nodes 150 to each other. Another switch 620 also couples all of the storage nodes 150 together. In this embodiment, each storage node 150 has two ports, with each port connecting to one of the switches 620. This arrangement of ports and switches 620 provides two paths for each storage node 150 to connect to any other storage node 150. For example, the left-most storage node 150 can connect to the rightmost storage node 150 (or any other storage node 150 in the storage cluster 160) via a choice of either the first switch 620 or the second switch 620. It should be appreciated that this architecture relieves communication bottlenecks. Further embodiments with one switch 620, two switches 620 coupled to each other, or more than two switches 620, and other numbers of ports, or networks, are readily devised in keeping with the teachings herein.

Figure 8B:
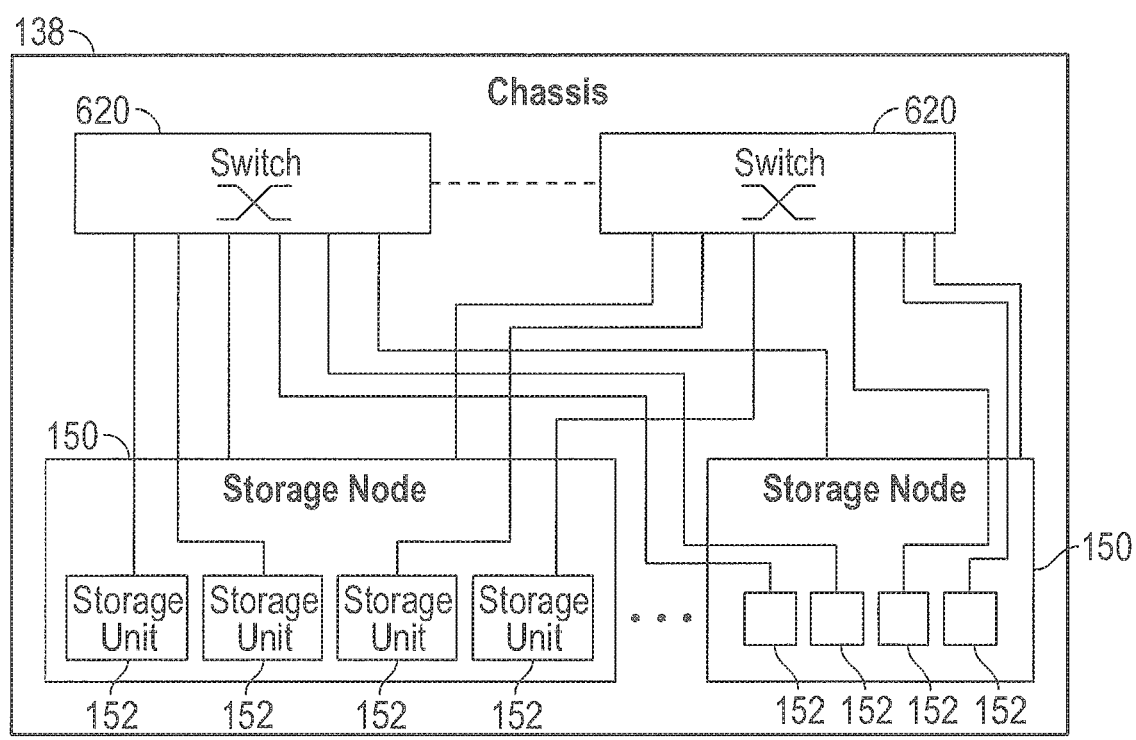
FIG. 8B is a variation of connectivity within the storage cluster of FIG. 8A, with the switches coupling the storage units in accordance with some embodiments.

FIG. 8B is a variation of the storage cluster 160 of FIG. 8A, with the switches 620 coupling the storage units 152. As in the embodiment in FIG. 8A, the switches 620 couple the storage nodes 150, providing two paths for each storage node 150 to communicate with any other storage node 150. In addition, the switches 620 couple the storage units 152. Two of the storage units 152 in each storage node 150 couple to one of the switches 620, and one or more of the storage units 152 in each storage node 150 couple to another one of the switches 620. In this manner, each storage unit 152 can connect to roughly half of the other storage units 152 in the storage cluster via one of the switches 620. In a variation, the switches 620 are coupled to each other (as shown in the dashed line in FIG. 8B), and each storage unit can connect to any other storage unit 152 via the switches 620. Further embodiments with one switch 620, or other numbers of switches 620 and arrangements of connections and the number of components being connected are readily devised in keeping with the teachings herein.

Figure 9A:
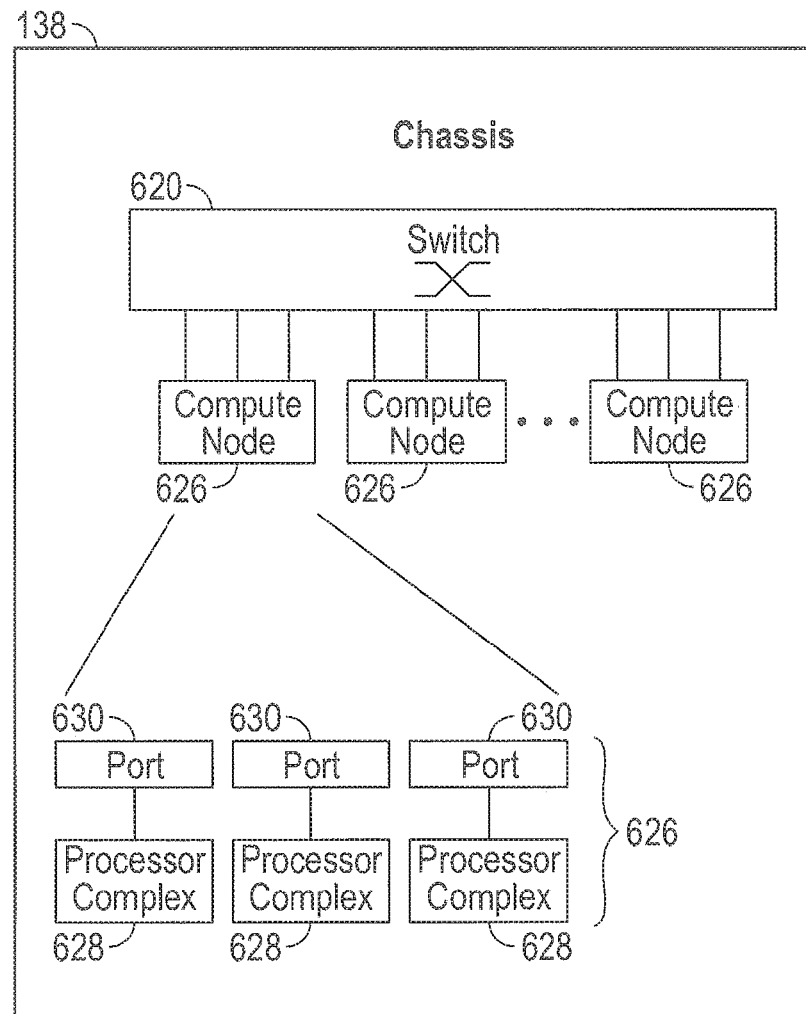
FIG. 9A is a block diagram of one example of an architecture for compute nodes coupled together for the storage cluster in accordance with some embodiments.

FIG. 9A is a block diagram of compute nodes 626 coupled together for the storage cluster 160. A switch 620 couples all of the compute nodes 626 together, so that each compute node 626 can communicate with any other compute node 626 via the switch 620. In various embodiments, each compute node 626 could be a compute-only storage node 150 or a specialized compute node 626. In the embodiment shown, the compute node 626 has three processor complexes 628. Each processor complex 628 has a port 630, and may also have local memory and further support (e.g., digital signal processing, direct memory access, various forms of I/O, a graphics accelerator, one or more processors, and so on). Each port 630 is coupled to the switch 620. Thus, each processor complex 628 can communicate with each other processor complex 628 via the associated port 630 and the switch 620, in this architecture. In some embodiments, each processor complex 628 issues a heartbeat (a regular communication that can be observed as an indicator of ongoing operation, with the lack of a heartbeat signaling a possible failure or unavailability of the compute node or processor). In some embodiments, each compute node 626 issues a heartbeat. Storage nodes 150 and/or storage units 152 also issue heartbeats, in further embodiments.

Figure 9B:
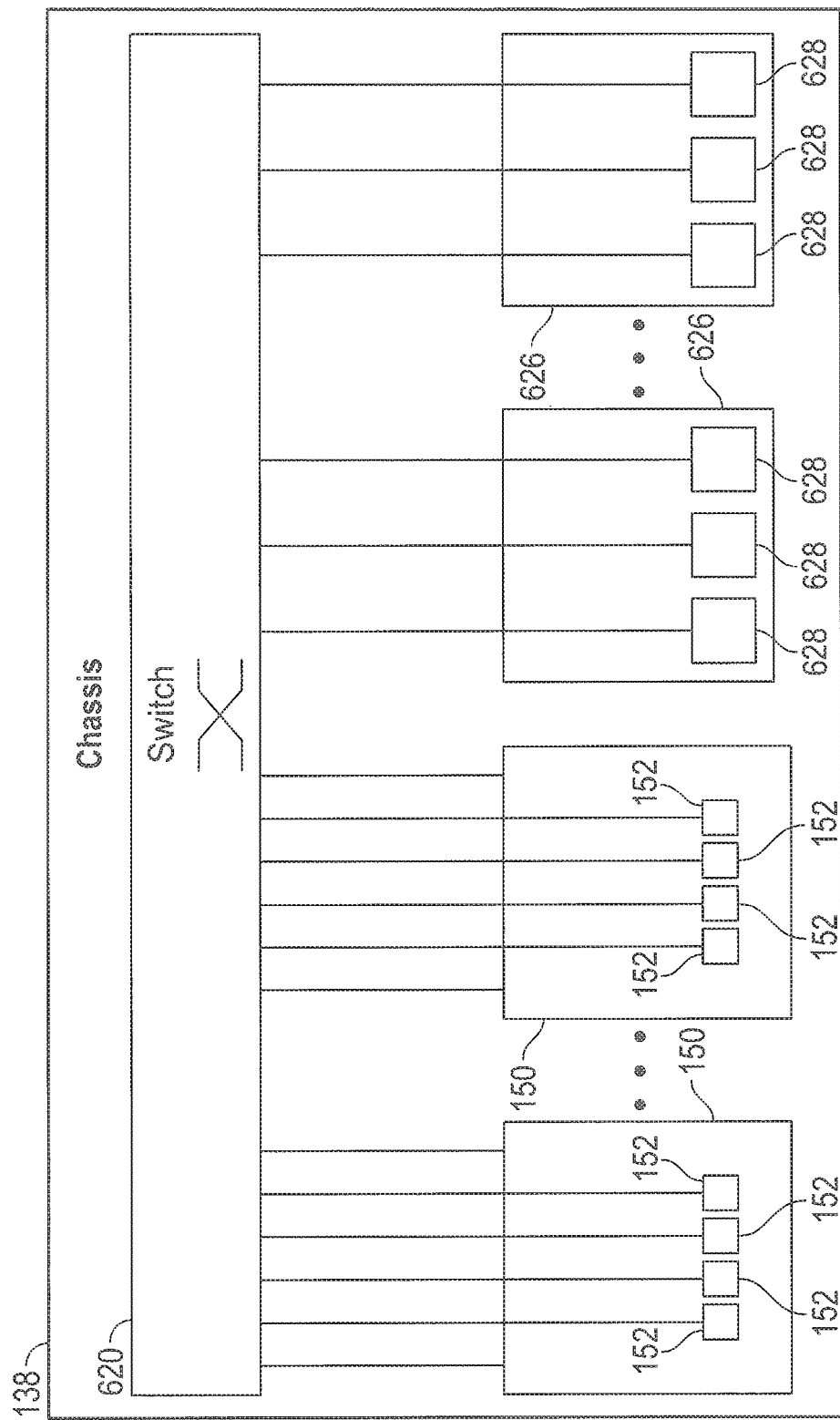
FIG. 9B is a block diagram of a further embodiment of the storage cluster of FIGS. 1-5, with the compute nodes of FIG. 9A in accordance with some embodiments.

FIG. 9B is a block diagram of a further embodiment of the storage cluster 160 of FIGS. 1-5, with the compute nodes 626 of FIG. 9A. This embodiment is also shown with storage nodes 150. A switch 620 couples all ports of all of the storage nodes 150, all ports of all of the compute nodes 626 (e.g., all processor complexes 628 of all of the compute nodes 626), and all storage units 152. In variations, fewer or more storage nodes 150, fewer or more compute nodes 626, fewer or more storage units 152, and fewer or more processor complexes 628 could be installed in the chassis 138. Each storage node 150, storage unit 152, or compute node 626 could occupy one or more slots 142 (see FIG. 1) in the chassis 138. It should be appreciated that FIGS. 9A and 9B are one example and not meant to be limiting. In some embodiments multiple switches 620 may be integrated into chassis 138 and the compute nodes 626 may be coupled to the multiple switches in order to achieve the communication flexibility provided by the embodiments described herein, similar to the embodiments of FIGS. 8A and 8B.

Figure 9C:
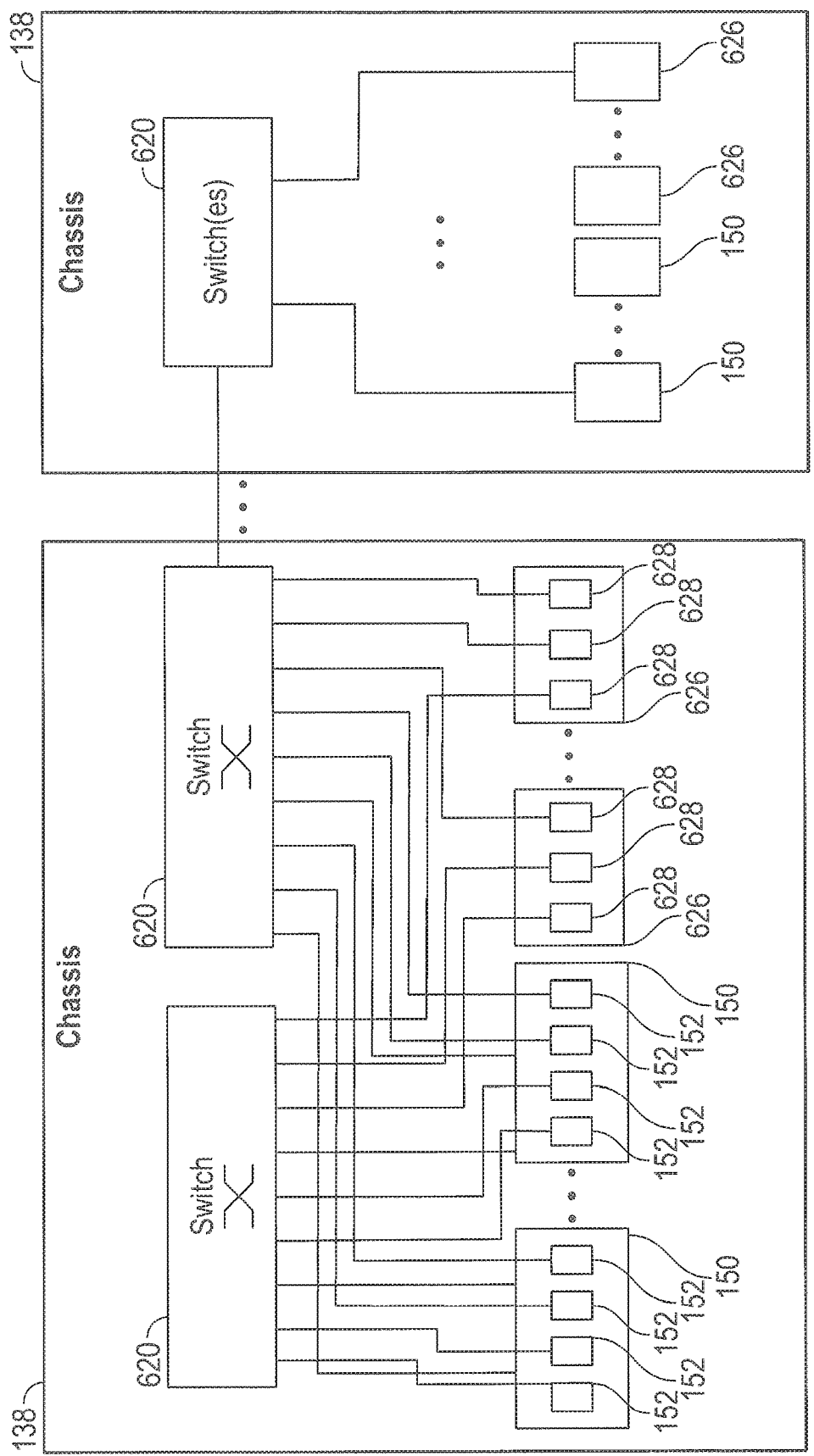
FIG. 9C is a block diagram of a variation of the storage cluster with compute nodes of FIG. 9B, depicting storage nodes, storage units and compute nodes in multiple chassis, all coupled together as one or more storage clusters and variations of connectivity within a chassis and between chassis in accordance with some embodiments.

FIG. 9C is a block diagram of a variation of the storage cluster 160 with compute nodes 626 of FIG. 9B, depicting storage nodes 150, storage units 152 and compute nodes 626 in multiple chassis 138, all coupled together as one or more storage clusters 160. Several chassis 138 could be rack-mounted and coupled together in the manner depicted, for expansion of a storage cluster 160. In this embodiment, the switch 620 or switches 620 in each chassis 138 couple the components in the chassis 138 as described above with reference to FIG. 9B, and the switch 620 or switches 620 in all of the chassis 138 are coupled together across all of the chassis 138. With various combinations of storage nodes 150 and/or compute nodes 626, storage capacity and/or compute capacity (e.g., for running applications, operating system(s), etc.) is readily configured and expanded or contracted, or virtualized in virtual computing environments. The use of switches 620 decreases or eliminates the usual patch wiring seen in many other rack-mounted systems.

Some embodiments of this and other versions of the storage cluster 160 can support two or more independent storage clusters, in one chassis 138, two chassis 138, or more chassis 138. Each storage cluster 160 in a multi-storage cluster environment can have storage nodes 150, storage units 152, and/or compute nodes 626 in one, another, or both or more chassis 138, in various combinations. For example, a first storage cluster 160 could have several storage nodes 150 in one chassis 138 and one or more storage nodes 150 in another chassis 138. A second storage cluster 160 could have one or more storage nodes 150 in the first chassis 138 and one or more storage nodes 150 in the second chassis 138. Either of these storage clusters 160 could have compute nodes 626 in either or both of the chassis 138. Each storage cluster 160 could have its own operating system, and have its own applications executing, independently of the other storage cluster(s) 160.

Figure 9D:
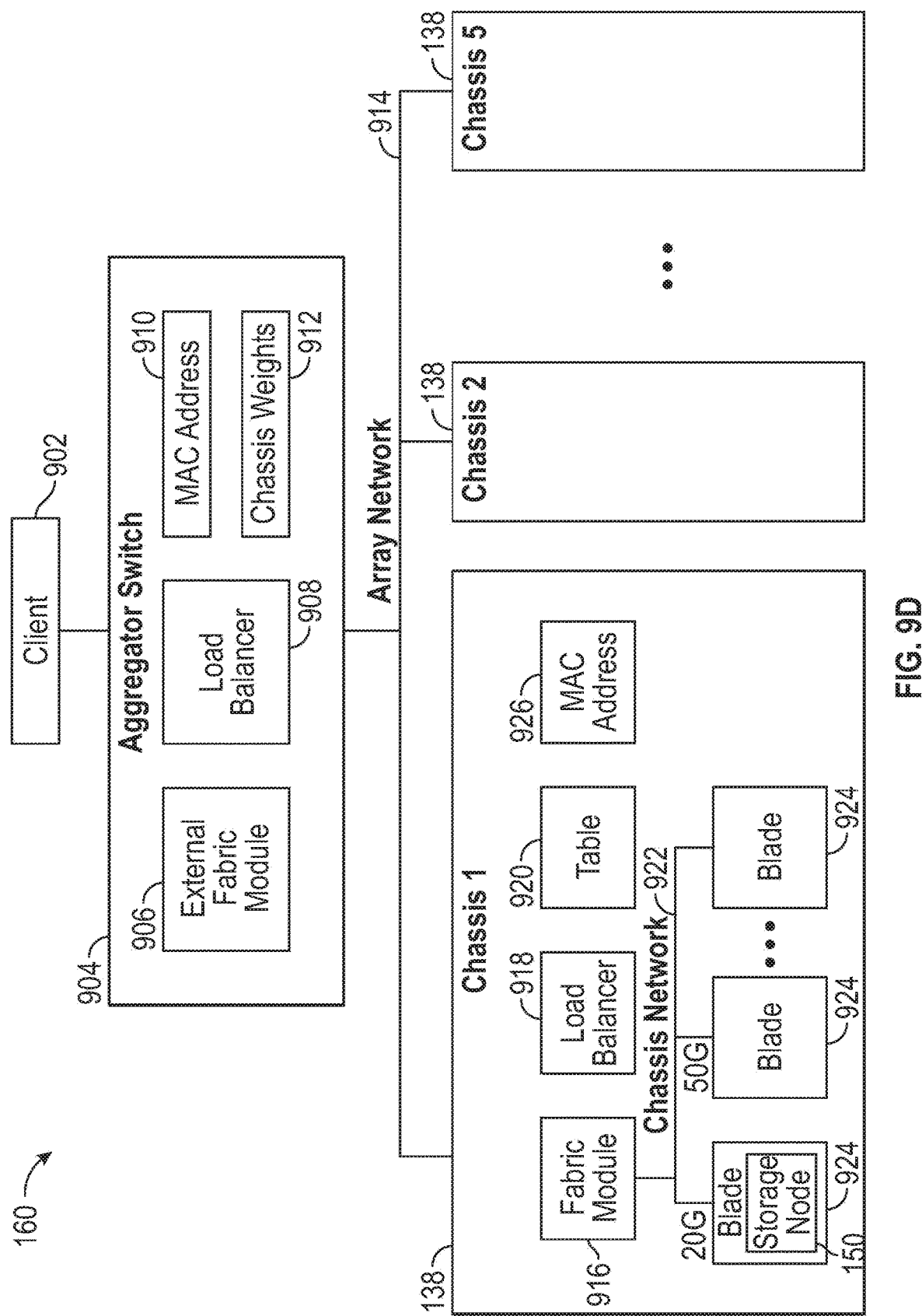
FIG. 9D is a block diagram of an embodiment of a multi-chassis storage cluster, depicting multilevel load-balancing in accordance with some embodiments.

FIG. 9D is a block diagram of an embodiment of a multi-chassis storage cluster 160, depicting multilevel load-balancing. An aggregator switch 904 is coupled through an array network 914 to multiple chassis 138, each of which has multiple blades 924 with storage nodes 150. Blades 924 and storage nodes 150 can be heterogeneous in each chassis 138 as well as across chassis 138 of the storage cluster 160, in type of blade, type of storage node, amount of storage memory and/or network bandwidth. Inside each chassis 138, a chassis network 922 couples to the blades 924 and storage nodes 150 in various versions, and need not be the same in all of the chassis 138.

A client 902 sees a single MAC (media access control) address 910 for the entire, multi-chassis storage cluster 160 in this embodiment. For a scenario of a packet from a client 902 addressed to the storage cluster 160, the packet arrives at the aggregator switch 904 that has the MAC address 910. A load balancer 908 adjusts load-balancing according to the chassis weights 912 of the multiple chassis 138 coupled to the array network 914. These chassis weights 912 are determined by the aggregator switch 904, for example using a processor, based on communication with the chassis 138 and the numbers of blades, storage nodes, and communication bandwidths of the chassis, blades and storage nodes, in various embodiments. For example, one of the chassis 138 could have more blades or storage nodes than another chassis, and have a higher chassis weight 912 assigned, while another chassis with fewer blades or storage nodes has a lower chassis weight 912. A chassis 138 that has blades of higher network bandwidth (e.g., more of the 50 G blades) could have a higher chassis weight 912 than another chassis 138 that has blades of lower network bandwidth (e.g. more of the 20 G blades). The load balancer 908 determines to which chassis 138 to send the packet, and sends the packet through the switches of the external fabric module 906, and the array network 914, to the selected chassis 138.

Each chassis presents a single MAC address 926, and it is in accordance with this MAC address 926 that the packet is sent to the selected chassis 138. After that chassis 138 (for example, in this scenario, chassis 1), a load balancer 918 determines to which blade 924 or storage node 150 to send the packet, and sends the packet through the switches of the fabric module 916 internal to the chassis 138, and through the chassis network 922, to the selected blade 924 or storage node 150. In some embodiments, the load balancer 918 does so through consultation with a table 920.

Through the multilevel load-balancing, a chassis 138 with more blades 924 or storage nodes 150, or greater network bandwidth from having more higher bandwidth blades or storage nodes, receives proportionally more packets. A 138 with fewer blades 924 or storage nodes 150, or less network bandwidth, receives proportionally fewer packets. By having the array network 914 coupling the aggregator switch 904 and the multiple chassis 138, and the chassis networks 922 inside the chassis 138, the multi-chassis storage cluster 160 avoids network bottlenecks and efficiently sends packets to blades 924 and storage nodes 150, with load-balancing at the aggregator switch 904 and further load-balancing at each chassis 138.

Multiple features are evident in some or all of the embodiments shown in FIGS. 6A-9D. Many embodiments provide a pathway such that each storage unit 152 can communicate directly with one or more other storage units 152 on such a pathway without assistance from any storage node 150. That is, a storage unit 152 can communicate with another storage unit 152, via a pathway, with storage nodes 150 being non-participatory in such communication. No storage node 150 intervenes in or assists communication via this direct pathway from one storage unit 152 to another storage unit 152. Some embodiments provide such a direct pathway for any communication from any storage unit 152 to any other storage unit 152. Some embodiments provide such a direct pathway for communication from each storage unit 152 to one or multiple other storage units 152, but not necessarily to all other storage units 152. In these cases, a storage unit 152 could communicate with another storage unit 152 via one or more of the storage nodes 150 and another pathway, i.e., with assistance from a storage node 150.

In some embodiments, a pathway for direct communication from one storage unit 152 to any other storage unit 152 is included in couplings of other components of the storage cluster 160. In some embodiments, each storage node 150 can communicate directly with each storage unit 152 in the entire storage cluster 160. In some embodiments, each storage node 150 can communicate with some of the storage units 152 directly, and communicate with other storage units 152 via another storage node 150. In some embodiments, the pathways for communication among storage nodes 150 and communication among storage units 152 are separated, in others these pathways are combined. In some embodiments, the pathways for communication between storage nodes 150 and storage units 152, and communication among storage units 152 are separated, and in others these pathways are combined.

One version of the storage node 150 has two ports 608, 610. Both ports 608, 610 are employed for communication to other storage nodes 150 via a choice of two different pathways, in some embodiments. One port 610 is employed for communication to other storage nodes 150 via one pathway, and another port 608 is employed for communication with storage units 152 via another pathway, in some embodiments. Both ports 608, 610 are employed for communication to storage nodes 150 and storage units 152, in some embodiments. By supporting direct communication among storage units 152, these various architectures can reduce communication bottlenecks. Storage nodes 150, and the processing and communication bandwidths are not tied up in supporting the communication among the storage units 152. As a result of this offloading, storage nodes 150 for faster operations on user data, or these functions can be transferred to the storage units 152.

Communications among storage units 152 can include data, metadata, messages to make sure storage units 152 are alive, health and/or status information, etc. With storage units 152 communicating directly with other storage units 152, without a storage node 150 (or processor or controller of a storage node 150) intervening, the storage node 150 is free to manage other processes. Communication between storage nodes 150 and storage units 152, or among storage units 152 when these take over some of the storage node 150 functions, can include data shards, with data, metadata (e.g., information about and associated with the data) and metametadata (e.g., metadata about the metadata). Such communication can also include parity shards, health, status and performance information. By making storage units 152 accessible by other storage units 152 or by storage nodes 150 (e.g., processors of storage nodes 150), the distinction of data ownership can be shifted to varying degrees from storage node 150 to storage units 152. This could involve shifting authorities 168 or wards among storage nodes 150 and storage units 152 in various ways in some embodiments.

With a storage unit 152 on a network, a storage unit 152 could communicate directly with a compute node 626. Such communication could involve embedding a compute node identifier into a request and having the storage unit 152 directly return data to the compute node 626 instead of returning data to a storage node 150 and then to the compute node 626. Direct connections for data, and data caching could be enabled for a compute node 626 which has the intelligence to find data in storage units 152. Compute nodes 626 could also be used for specialized processing in a data pipeline implementing filtering, transformations, etc., for data going to or coming from storage units 152. The architectures disclosed in FIGS. 6A-9D thus show flexibility for arrangement of components and communication among the components in storage systems and storage and computing systems. Depending upon data throughput and communication throughput, and absolute or relative amounts of data and compute function needs and projected growth, one architecture may be more suitable than another. Storage capacity and compute capacity are adjustable, expandable and scalable, in various embodiments. In addition, the embodiments provide more flexibility for load balancing.

Storage clusters 160, in various embodiments as disclosed herein, can be contrasted with storage arrays in general. The storage nodes 150 are part of a collection that creates the storage cluster 160. Each storage node 150 owns a slice of data and computing required to provide the data. Multiple storage nodes 150 are required to cooperate to store and retrieve the data. Storage memory or storage devices, as used in storage arrays in general, are less involved with processing and manipulating the data. Storage memory or storage devices in a storage array receive commands to read, write, or erase data. The storage memory or storage devices in a storage array are not aware of a larger system in which they are embedded, or what the data means. Storage memory or storage devices in storage arrays can include various types of storage memory, such as RAM, solid state drives, hard disk drives, etc. The storage units 152 described herein have multiple interfaces active simultaneously and serving multiple purposes. In some embodiments, some of the functionality of a storage node 150 is shifted into a storage unit 152, transforming the storage unit 152 into a combination of storage unit 152 and storage node 150. Placing computing (relative to storage data) into the storage unit 152 places this computing closer to the data itself. The various system embodiments have a hierarchy of storage node layers with different capabilities. By contrast, in a storage array, a controller owns and knows everything about all of the data that the controller manages in a shelf or storage devices. In a storage cluster 160, as described herein, multiple controllers in multiple storage units 152 and/or storage nodes 150 cooperate in various ways (e.g., for erasure coding, data sharding, metadata communication and redundancy, storage capacity expansion or contraction, data recovery, and so on).

Figure 10A:
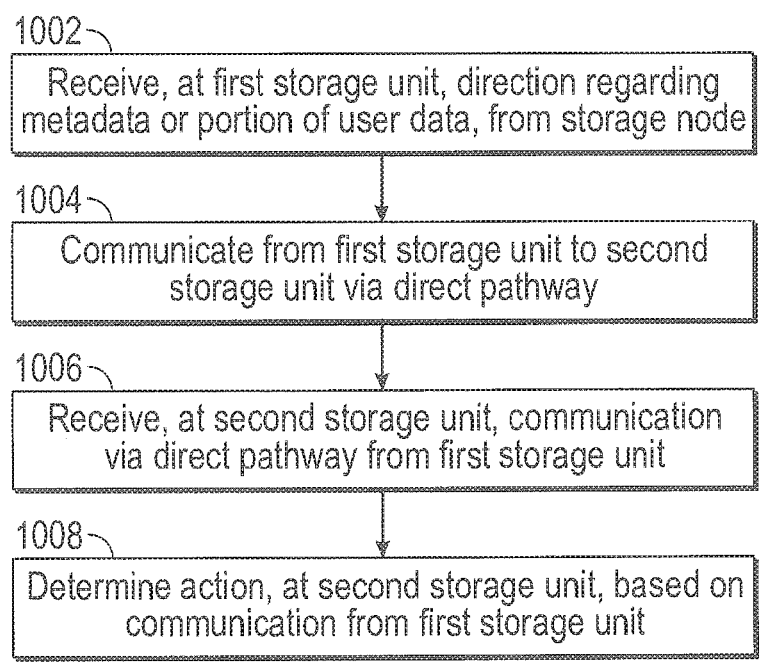
FIG. 10A is a flow diagram of a method for operating a storage cluster, which can be practiced on or by embodiments of the storage cluster, storage nodes and/or non-volatile solid state storages or storage units in accordance with some embodiments.

FIG. 10A is a flow diagram of a method for operating a storage cluster, which can be practiced on or by embodiments of the storage cluster, storage nodes and/or nonvolatile solid state storages or storage units in accordance with some embodiments. In an action 1002, a first storage unit receives a direction regarding metadata or a portion of user data, from a storage node of a storage cluster. For example, the direction could include a direction to store a portion of user data or a data shard, read a portion of user data or a data shard, construct data from data shards, read or write a parity shard, a direction to respond about health, status or performance, etc.

In an action 1004, the first storage unit communicates directly with a second storage unit via a pathway that does not require assistance from any storage node or storage nodes. This communication could involve communicating about the metadata or the portion of user data. A suitable example of communication about the metadata is communication of a heartbeat (which relates to the direction to respond about health, status or performance). Examples of communication about the portion of the user data would be to request a data shard from another storage unit, or to send a parity shard to another storage unit for writing into flash memory of that storage unit. Further examples are readily devised in keeping with the teachings herein. In an action 1006, the second storage unit receives the communication from the first storage unit, via the pathway. More specifically, the second storage unit receives the communication directly from the first storage unit, not from a storage node.

In an action 1008, the second storage unit determines an action, based on the communication from the first storage unit. Depending on content of the communication, the second storage unit could store data, store metadata, read data or metadata and send it back to the first storage unit, respond to an inquiry from the first storage unit, and so on. A response, where appropriate, could be sent from the second storage unit back to the first storage unit, or to another storage unit, via a pathway that does not require assistance from any storage node or storage nodes. Or, the action could be for the second storage unit to communicate with one of the storage nodes, or a compute node. Further examples of actions are readily devised in keeping with the teachings herein.

Figure 10B:
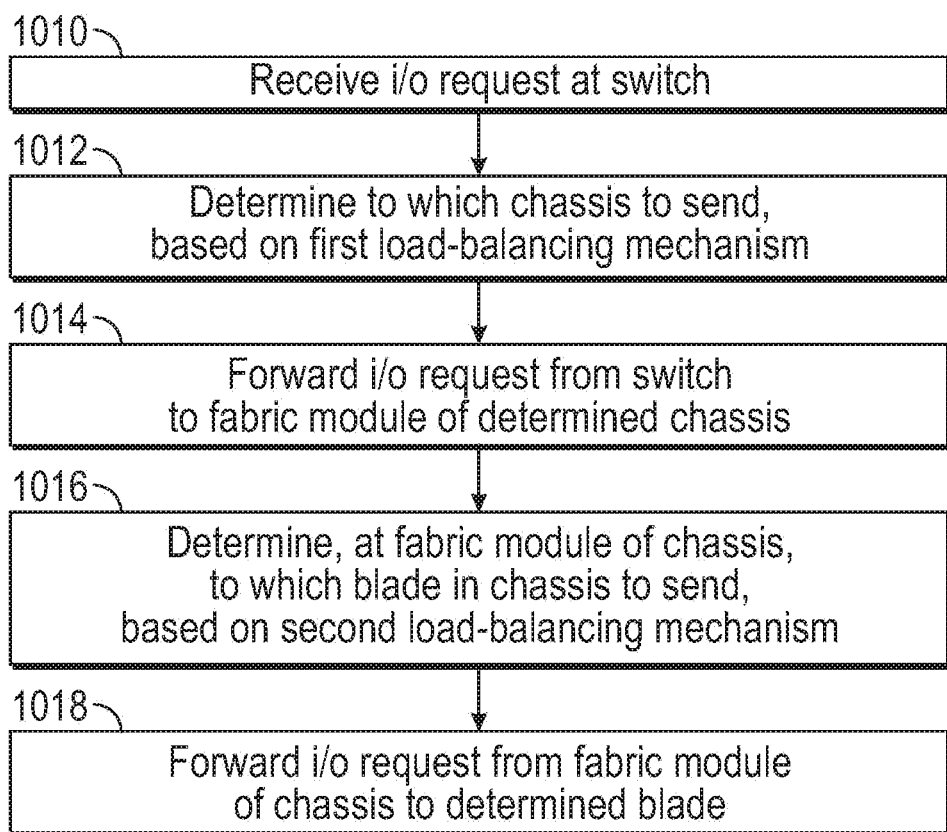
FIG. 10B is a flow diagram of a method of load-balancing for a storage system in accordance with some embodiments.

FIG. 10B is a flow diagram of a method of load-balancing for a storage system. The method can be practiced by embodiments of the multi-chassis storage cluster with multilevel load-balancing, and various embodiments of storage systems described herein. In an action 1010, an I/O request is received at a switch. For example, this could be the aggregator switch that is coupled through an array network to multiple chassis, as shown in FIG. 9D. In an action 1012, the aggregator switch determines to which chassis to send the I/O request, based on a first load-balancing mechanism. In an action 1014, the I/O request is forwarded from the switch to a fabric module of the determined chassis. In some embodiments, each chassis presents a MAC address, which is used for such forwarding. The forwarding is through the array network, in some embodiments.

In an action 1016, the fabric module of the chassis determines to which blade in the chassis to send the I/O request, based on a second load-balancing mechanism. For example, in the multilevel load-balancing described with reference to FIG. 9D, the first load-balancing mechanism is in the aggregator switch and the second load-balancing mechanism is in each chassis, at the fabric module. In an action 1018, the I/O request is forwarded from the fabric module of the chassis to the determined blade. This forwarding is through the chassis network, in some embodiments.

Figure 11:
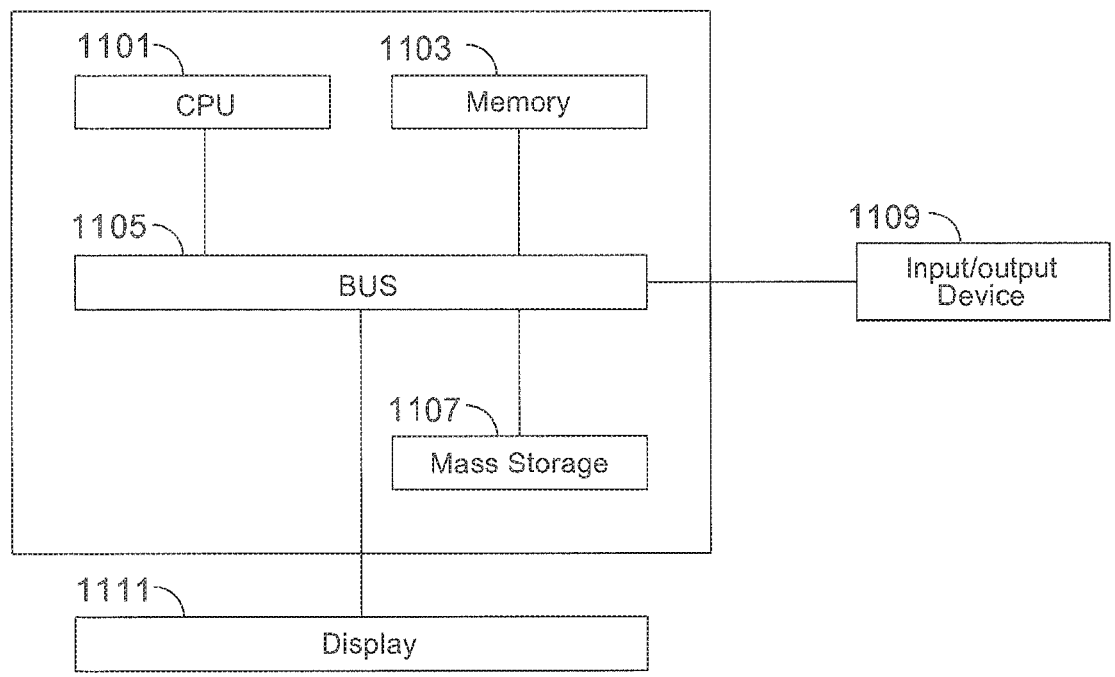
FIG. 11 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 11 is an illustration showing an exemplary computing device which may implement the embodiments described herein. The computing device of FIG. 11 may be used to perform embodiments of the functionality for a storage node or a non-volatile solid state storage unit in accordance with some embodiments. The computing device includes a central processing unit (CPU) 1101, which is coupled through a bus 1105 to a memory 1103, and mass storage device 1107. Mass storage device 1107 represents a persistent data storage device such as a disc drive, which may be local or remote in some embodiments. The mass storage device 1107 could implement a backup storage, in some embodiments. Memory 1103 may include read only memory, random access memory, etc. Applications resident on the computing device may be stored on or accessed via a computer readable medium such as memory 1103 or mass storage device 1107 in some embodiments. Applications may also be in the form of modulated electronic signals modulated accessed via a network modem or other network interface of the computing device. It should be appreciated that CPU 1101 may be embodied in a general-purpose processor, a special purpose processor, or a specially programmed logic device in some embodiments.

Display 1111 is in communication with CPU 1101, memory 1103, and mass storage device 1107, through bus 1105. Display 1111 is configured to display any visualization tools or reports associated with the system described herein. Input/output device 1109 is coupled to bus 505 in order to communicate information in command selections to CPU 1101. It should be appreciated that data to and from external devices may be communicated through the input/output device 1109. CPU 1101 can be defined to execute the functionality described herein to enable the functionality described with reference to FIGS. 1-6. The code embodying this functionality may be stored within memory 1103 or mass storage device 1107 for execution by a processor such as CPU 1101 in some embodiments. The operating system on the computing device may be MS-WINDOWS™, UNIX™, LINUX™, iOS, CentOSM, Android™, Redhat Linux™, z/OS™, or other known operating systems. It should be appreciated that the embodiments described herein may be integrated with virtualized computing system also.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand. The service provider may host the software, or may deploy the software to a customer for a given period of time. Numerous combinations of the above models are possible and are contemplated.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A storage system, comprising:
a load balancer to perform a first load balancing operation to identify a storage node within a storage array among a plurality of storage arrays to which data should be transmitted, wherein the storage array is identified through an interconnect according to a second load balancing mechanism.

2. The storage system of claim 1, wherein each of the plurality of storage arrays includes a plurality of blades, in which one of the plurality of blades has a differing network bandwidth than another one of the plurality of blades.

3. The storage system of claim 1, wherein each of the plurality of storage arrays includes a plurality of blades, in which one of the plurality of blades has a differing capacity of non-volatile storage than another one of the plurality of blades.

4. The storage system of claim 1, wherein the one of the plurality of storage arrays contain storage units having non-volatile memory of differing capacity.

5. The storage system of claim 1, wherein the second load balancing mechanism is based on a table accessed by a fabric module of the storage array, and wherein the fabric module is configurable to forward packets to a blade in a differing storage array.

6. The storage system of claim 4, wherein storage units of differing blades can communicate with each other without assistance from storage nodes.

7. The storage system of claim 1, wherein the storage system presents a single media access control address to external networks and wherein each of the plurality of storage arrays within the storage system is assigned a unique media access control address.

8. A method, comprising:
forwarding an input/output (I/O) request from a fabric module of one of a plurality of storage arrays to one of multiple storage nodes within one of the storage arrays based upon a first load balancing mechanism, wherein the I/O request was received a switch according to a second load balancing mechanism.

9. The method of claim 8, wherein the first load balancing mechanism is based on an amount of blades within each of multiple chassis and the second load balancing mechanism differs from the first load balancing mechanism.

10. The method of claim 8, wherein each of the plurality of storage arrays includes a plurality of blades, in which one of the plurality of blades has a differing capacity of non-volatile storage than another one of the plurality of blades.

11. The method of claim 10, wherein the one of the plurality of blades contains storage units having non-volatile memory of differing capacity.

12. The method of claim 11 wherein storage units of differing blades can communicate with each other without assistance from storage nodes.

13. The method of claim 8, wherein a storage system presents a single media access control address to external networks and wherein each one of the multiple storage arrays is assigned a unique media access control address.

14. The method of claim 8, wherein storage arrays with differing blade populations receive differing traffic loads.

15. A tangible, non-transitory, computer-readable media having instructions thereupon which, when executed by a processor, cause the processor to perform a method comprising:
forwarding an input/output (I/O) request from a fabric module of one of a plurality of storage arrays to one of multiple storage nodes within one of the storage arrays based upon a first load balancing mechanism, wherein the I/O request was received a switch according to a second load balancing mechanism.

16. The computer-readable media of claim 15, wherein the first load balancing mechanism is based on an amount of blades within each of multiple chassis and the second load balancing mechanism differs from the first load balancing mechanism.

17. The computer-readable media of claim 15, wherein each of the plurality of storage arrays includes a plurality of blades, in which one of the plurality of blades has a differing capacity of non-volatile storage than another one of the plurality of blades.

18. The computer-readable media of claim 17, wherein the one of the plurality of blades contains storage units having non-volatile memory of differing capacity.

19. The computer-readable media of claim 18, wherein storage units of differing blades can communicate with each other without assistance from storage nodes.

20. The computer-readable media of claim 15, wherein a storage system presents a single media access control address to external networks and wherein each one of the multiple storage arrays is assigned a unique media access control address.

* * * * *